United States Patent
Lill et al.

(10) Patent No.: US 10,424,461 B2
(45) Date of Patent: *Sep. 24, 2019

(54) CONTROLLING ION ENERGY WITHIN A PLASMA CHAMBER

(71) Applicant: Lam Research Corporation, Fremont, CA (US)

(72) Inventors: Thorsten Lill, Santa Clara, CA (US); Harmeet Singh, Fremont, CA (US); Alex Paterson, San Jose, CA (US); Gowri Kamarthy, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/189,329

(22) Filed: Nov. 13, 2018

(65) Prior Publication Data

US 2019/0103253 A1    Apr. 4, 2019

Related U.S. Application Data

(63) Continuation of application No. 15/261,738, filed on Sep. 9, 2016, now Pat. No. 10,141,163, which is a continuation of application No. 13/930,138, filed on Jun. 28, 2013, now Pat. No. 9,460,894.

(51) Int. Cl.
*H01J 37/32* (2006.01)

(52) U.S. Cl.
CPC ...... *H01J 37/32174* (2013.01); *H01J 37/321* (2013.01); *H01J 37/32082* (2013.01); *H01J 37/32128* (2013.01); *H01J 37/32146* (2013.01); *H01J 37/32422* (2013.01); *H01J 37/32706* (2013.01)

(58) Field of Classification Search
None
See application file for complete search history.

(56) References Cited

U.S. PATENT DOCUMENTS 6,319,355 B1 * 11/2001 Holland ............... H01J 37/321
                                                       118/723 I
6,563,076 B1 *  5/2003 Benjamin ........ H01J 37/32082
                                                       118/732 I (Continued)

*Primary Examiner* — Dion Ferguson
*Assistant Examiner* — Srinivas Sathiraju
(74) *Attorney, Agent, or Firm* — Penilla IP, APC

(57) ABSTRACT

Systems and methods controlling ion energy within a plasma chamber are described. One of the systems includes an upper electrode coupled to a sinusoidal RF generator for receiving a sinusoidal signal and a nonsinusoidal RF generator for generating a nonsinusoidal signal. The system further includes a power amplifier coupled to the nonsinusoidal RF generator. The power amplifier is used for amplifying the nonsinusoidal signal to generate an amplified signal. The system includes a filter coupled to the power amplifier. The filter is used for filtering the amplified signal using a filtering signal to generate a filtered signal. The system includes a chuck coupled to the filter. The chuck faces at least a portion of the upper electrode and includes a lower electrode. The lower electrode is used for receiving the filtered signal to facilitate achieving ion energy at the chuck to be between a lower threshold and an upper threshold.

21 Claims, 14 Drawing Sheets

(56) References Cited

U.S. PATENT DOCUMENTS

| | | | | |
|---|---|---|---|---|
| 6,824,813 B1* | 11/2004 | Lill | ................ | C23C 16/401 118/665 |
| 7,019,543 B2* | 3/2006 | Quon | ................ | G01R 27/2641 324/464 |
| 7,029,594 B2* | 4/2006 | Yasui | ................ | H01J 37/32082 156/345.28 |
| 7,373,899 B2* | 5/2008 | Sumiya | ................ | C23C 16/507 118/723 E |
| 7,405,521 B2* | 7/2008 | Dhindsa | ................ | H01J 37/32082 118/723 R |
| 7,811,410 B2* | 10/2010 | Leming | ................ | H03B 21/00 118/723 E |
| 7,875,859 B2* | 1/2011 | Chen | ................ | H01J 37/05 250/396 R |
| 8,083,961 B2* | 12/2011 | Chen | ................ | B05D 3/145 156/345.24 |
| 8,324,574 B2* | 12/2012 | Own | ................ | H01J 37/153 250/306 |
| 8,455,842 B2* | 6/2013 | Zhang | ................ | B82Y 30/00 250/307 |
| 9,105,447 B2* | 8/2015 | Brouk | ................ | H01J 37/32091 |
| 9,460,894 B2* | 10/2016 | Lill | ................ | H01J 37/32146 |
| 10,141,163 B2* | 11/2018 | Lill | ................ | H01J 37/32146 |
| 2003/0082835 A1* | 5/2003 | McChesney | ................ | H01J 37/32082 438/10 |
| 2005/0034816 A1* | 2/2005 | Shannon | ................ | H01J 37/32082 156/345.43 |
| 2009/0004875 A1* | 1/2009 | Shen | ................ | H01L 21/0337 438/735 |
| 2010/0009470 A1* | 1/2010 | Davis | ................ | B82Y 10/00 438/9 |
| 2010/0018648 A1* | 1/2010 | Collins | ................ | H01J 37/32082 156/345.24 |
| 2010/0248488 A1* | 9/2010 | Agarwal | ................ | H01J 37/32091 438/714 |
| 2012/0273341 A1* | 11/2012 | Agarwal | ................ | H01J 37/32082 204/164 |
| 2013/0214828 A1* | 8/2013 | Valcore, Jr. | ................ | H01J 37/32146 327/141 |
| 2014/0062303 A1* | 3/2014 | Hoffman | ................ | H05H 1/46 315/111.21 |
| 2014/0265910 A1* | 9/2014 | Kobayashi | ................ | H01J 37/32183 315/246 |
| 2014/0345802 A1* | 11/2014 | Umehara | ................ | H05H 1/46 156/345.28 |
| 2014/0361690 A1* | 12/2014 | Yamada | ................ | H01J 37/32091 315/111.21 |
| 2015/0002018 A1* | 1/2015 | Lill | ................ | H01J 37/32146 315/111.21 |
| 2015/0007940 A1* | 1/2015 | Kaneko | ................ | H01J 37/32302 156/345.41 |
| 2015/0032245 A1* | 1/2015 | Valcore, Jr. | ................ | H01J 37/32926 700/121 |

* cited by examiner

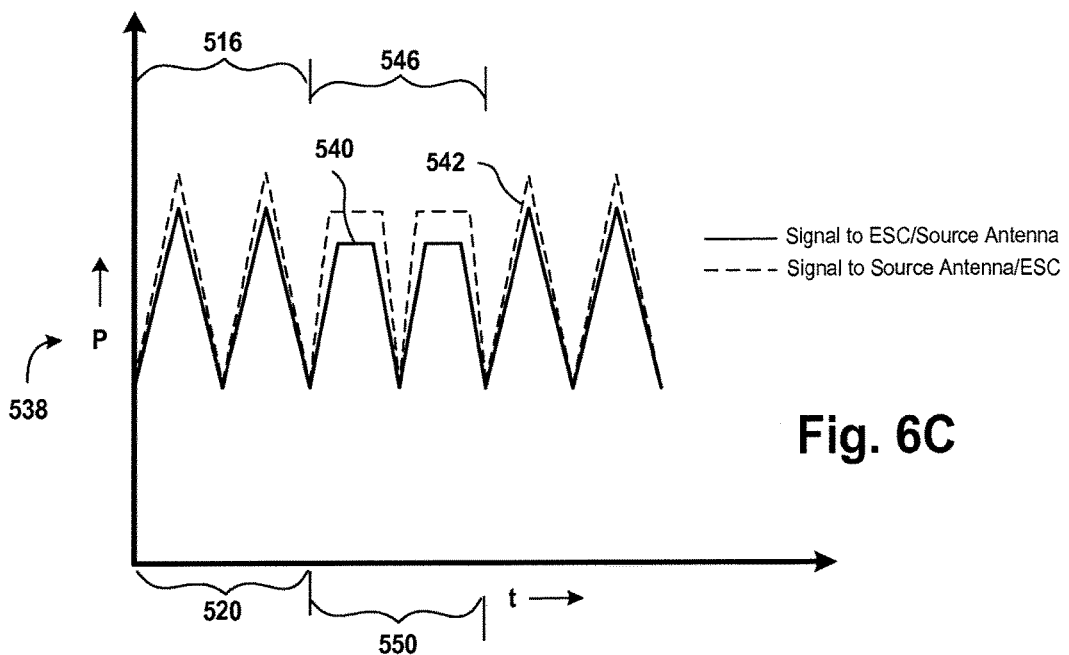
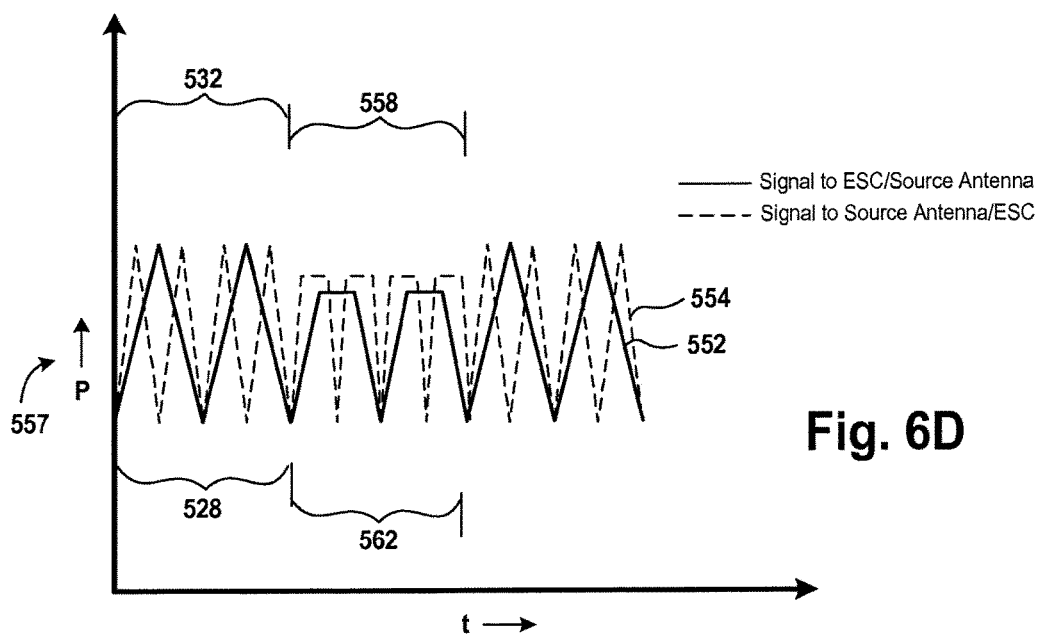

|  | Recipe A | Recipe B |
|---|---|---|
| Pressure | $a_1$ | $a_2$ |
| Temp. | $b_1$ | $b_2$ |
| Process Gas | $c_1$ | $c_2$ |
| Freq. | $d_1$ | $d_2$ |
| Gap | $e_1$ | $e_2$ |
| Pre-deter. Power Profile | $f_1$ $g_1$ $h_1$ $i_1$ | $f_2$ $g_2$ $h_2$ $i_2$ |

Fig. 11

CONTROLLING ION ENERGY WITHIN A PLASMA CHAMBER

CLAIM OF PRIORITY

The present patent application is a continuation of and claims the benefit of and priority, under 35 U.S.C. § 120, to a U.S. patent application having application Ser. No. 15/261,738, filed on Sep. 9, 2016, and titled "CONTROLLING ION ENERGY WITHIN A PLASMA CHAMBER", which is a continuation of and claims the benefit of and priority, under 35 U.S.C. § 120, to a U.S. patent application having application Ser. No. 13/930,138, filed on Jun. 28, 2013, titled "CONTROLLING ION ENERGY WITHIN A PLASMA CHAMBER", and now issued as U.S. Pat. No. 9,460,894, both of which are incorporated by reference herein in their entirety.

FIELD

The present embodiments relate to controlling ion energy within a plasma chamber.

BACKGROUND

In plasma-based systems, one or more radio frequency (RF) generators generate RF signals. The RF signals are provided to a plasma chamber to generate plasma within the plasma chamber. The plasma is used for a variety of purposes, e.g., to etch a wafer, to clean a wafer, to deposit materials on a wafer, etc.

As time has progressed, a wafer and any layers deposited on the wafer have become thin. When a layer is thin and etching is performed, various techniques, e.g., an interferometric endpoint detection technique, a time measuring technique, etc., are used to determine whether the etching is to be stopped.

However, regardless of whether the techniques are used, the etching may occur in undesirable areas on the wafer or on a layer on top of the wafer.

It is in this context that embodiments described in the present disclosure arise.

SUMMARY

Embodiments of the disclosure provide apparatus, methods and computer programs for controlling ion energy within a plasma chamber. It should be appreciated that the present embodiments can be implemented in numerous ways, e.g., a process, an apparatus, a system, a device, or a method on a computer-readable medium. Several embodiments are described below.

In some embodiments, ion energy is confined to be between two thresholds, an upper threshold and a lower threshold. For example, a difference between the upper and lower thresholds is greater than 0 electron volts (eV) and less than 10 eV. As another example, a difference between the upper and lower thresholds is greater than 0 eV and less than 5 eV. By confining the ion energy range, a precise ion energy intensity is achieved and etching is controlled.

In several embodiments, a system for controlling ion energy within a plasma chamber is described. The system includes a sinusoidal radio frequency (RF) generator for generating a sinusoidal signal, an upper electrode coupled to the sinusoidal RF generator for receiving the sinusoidal signal, and a nonsinusoidal RF generator for generating a nonsinusoidal signal. The system further includes a power amplifier coupled to the nonsinusoidal RF generator. The power amplifier is used for amplifying the nonsinusoidal signal to generate an amplified signal. The system includes a filter coupled to the power amplifier. The filter is used for filtering the amplified signal using a filtering signal to generate a filtered signal. The system includes a chuck coupled to the filter. The chuck faces at least a portion of the upper electrode and includes a lower electrode. The lower electrode is used for receiving the filtered signal to facilitate achieving ion energy at the chuck to be between a lower threshold and an upper threshold.

In a number of embodiments, a system for controlling ion energy within a plasma chamber is described. The system includes a sinusoidal radio frequency (RF) generator for generating a sinusoidal signal, a chuck coupled to the sinusoidal RF generator for receiving the sinusoidal signal, and a nonsinusoidal radio frequency (RF) generator for generating a nonsinusoidal signal. The system further includes a power amplifier coupled to the nonsinusoidal RF generator. The power amplifier amplifies the nonsinusoidal signal to generate an amplified signal. The system includes a filter coupled to the power amplifier for filtering the amplified signal using a filtering signal to generate a filtered signal. The system includes an upper electrode, e.g., an antenna, etc., coupled to the filter. The upper electrode faces the chuck and receives the filtered signal to facilitate achieving ion energy at the chuck to be between a lower threshold and an upper threshold.

A system for controlling ion energy within a plasma chamber is described. The system includes a first nonsinusoidal radio frequency (RF) generator for generating a first nonsinusoidal signal and a first power amplifier coupled to the first nonsinusoidal RF generator. The first power amplifier amplifies the first nonsinusoidal signal to generate a first amplified signal. The system includes a first filter coupled to the first power amplifier. The first filter filters the first amplified signal using a first filtering signal to generate a first filtered signal. The system includes an upper electrode coupled to the first filter, a second nonsinusoidal RF generator for generating a second nonsinusoidal signal, and a second power amplifier coupled to the second nonsinusoidal RF generator. The second power amplifier amplifies the second nonsinusoidal signal to generate a second amplified signal. The system includes a second filter coupled to the second power amplifier. The second filter filters the second amplified signal using a second filtering signal to generate a second filtered signal. The system includes a chuck coupled to the second filter. The chuck faces the upper electrode and includes a lower electrode. The lower electrode receives the second filtered signal to facilitate achieving the ion energy at the chuck to be between the lower threshold and the upper threshold. The upper electrode receives the first filtered signal to facilitate achieving ion energy at the chuck to be between a lower threshold and an upper threshold.

Some advantages of the above-described embodiments include confining ion energy between the upper and lower thresholds. The confinement is achieved with the use of a filtered amplified signal that is supplied to the chuck, a filtered amplified signal that is supplied to the surface antenna, or filtered amplified signals that are supplied to both the chuck and the surface antenna.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 6C is an embodiment of a graph that plots two filtered nonsinusoidal signals, where the filtered nonsinusoidal signals have the same frequency and a filtered portion of each filtered nonsinusoidal signal is different in shape than an unfiltered portion of the filtered nonsinusoidal signal.

FIG. 6D is an embodiment of a graph that plots two filtered nonsinusoidal signals, where the filtered nonsinusoidal signals have different frequencies and a filtered portion of each filtered nonsinusoidal signal is different in shape than an unfiltered portion of the filtered nonsinusoidal signal.

FIG. 11 is a diagram of embodiment of a database that includes recipes that include power profiles of amplified nonsinusoidal RF signals.

DETAILED DESCRIPTION

The following embodiments describe systems and methods for controlling ion energy within a plasma chamber. It will be apparent that the present embodiments may be practiced without some or all of these specific details. In other instances, well known process operations have not been described in detail in order not to unnecessarily obscure the present embodiments.

Figure 1A:
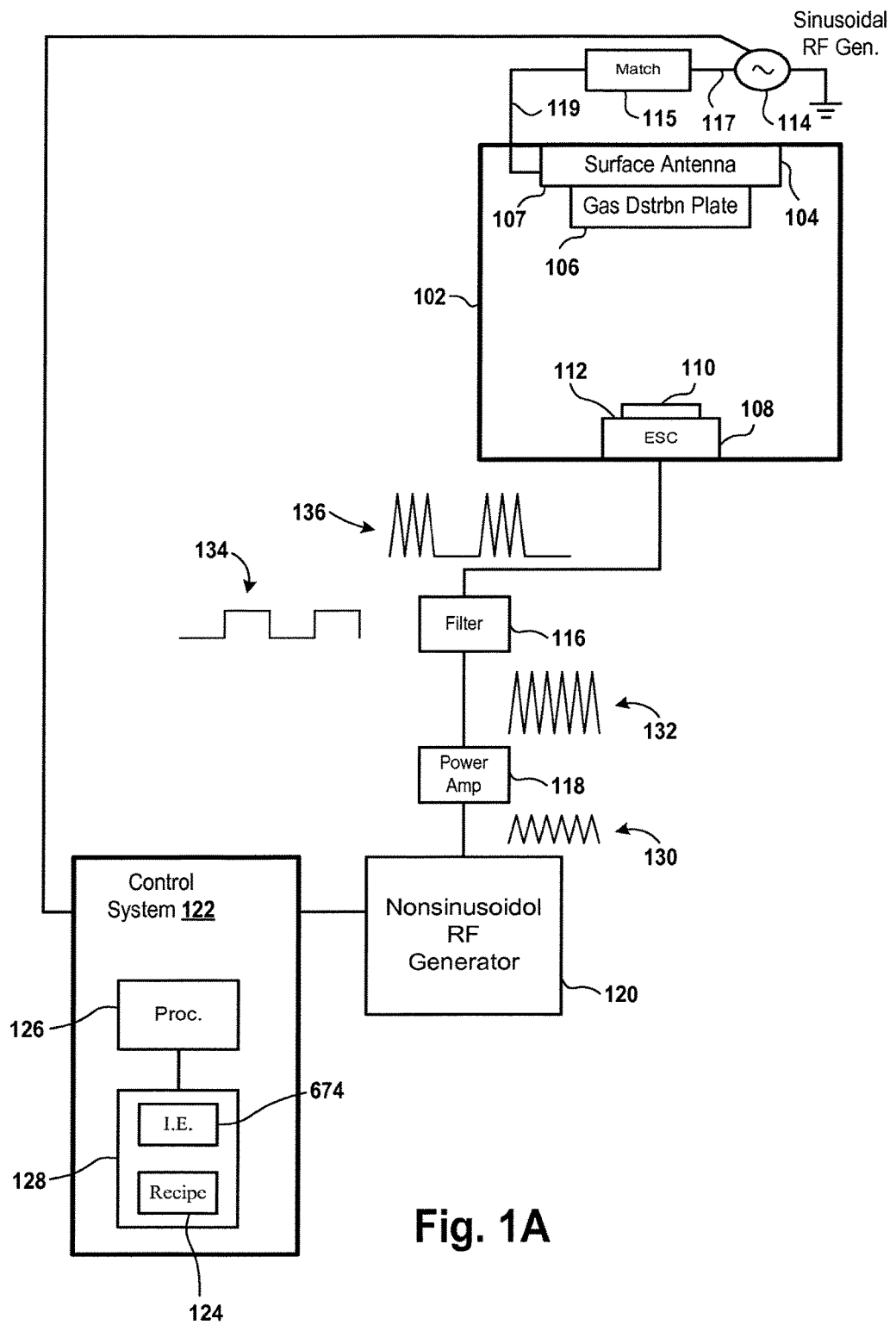
FIG. 1A is a block diagram of an embodiment of a system for controlling ion energy within a plasma chamber by providing a nonsinusoidal radio frequency (RF) signal to an electrostatic chuck (ESC).

FIG. 1A is a block diagram of an embodiment of a system 100 for controlling ion energy within a plasma chamber 102 by providing a nonsinusoidal radio frequency (RF) signal to an electrostatic chuck (ESC) 108. The ESC 108 includes a lower electrode and other layers, e.g., a ceramic layer, etc. The plasma chamber 102 includes a surface antenna 104, a gas distribution plate 106, and the ESC 108.

In a number of embodiments, a Faraday shield is located within, above, or below the surface antenna 104 to permit magnetic field coupling to plasma formed within the plasma chamber 102 and to reduce chances of electric field coupling, which could induce gradients or non-uniformities in the plasma, or accelerate charge particles within the plasma to higher energies.

The surface antenna 104 is an example of an upper electrode. Another example of the upper electrode includes a capacitive plate (not shown), which is one of two plates of a capacitor. The capacitive plate (not shown) is located opposite to and facing the ESC 108.

In some embodiments, instead of the ESC 108, a magnetic chuck is used.

The ESC 108 is located opposite to and faces the surface antenna 104 and the gas distribution plate 106. For example, the ESC 108 is located on a side of the plasma chamber 102 that is opposite to a side at which the surface antenna 104 is located. As another example, at least a portion of the bottom surface 107 of the surface antenna 104 faces a top surface 112 of the ESC 108 when a workpiece 110 is not placed on the ESC 108. The portion of the bottom surface 107 that faces the top surface 112 when the workpiece 110 is not present within the plasma chamber 102 is not covered by the gas distribution plate 102. The workpiece 110 is further described below.

In various embodiments in which the capacitive plate is used, the gas distribution plate is located above the capacitive plate or is embedded within the capacitive plate. For example, the capacitive plate includes gas inlets for allowing passage of a process gas into a space within the plasma chamber 102.

In a number of embodiments, another plasma chamber, which may be used instead of the plasma chamber 102, includes the ESC 108, the capacitive plate, and other components (not shown), e.g., an upper dielectric ring surrounding the capacitive plate, an upper electrode extension surrounding the upper dielectric ring, a lower dielectric ring surrounding the ESC 108, a lower electrode extension surrounding the lower dielectric ring, an upper plasma exclusion zone (PEZ) ring, a lower PEZ ring, etc.

The workpiece 110, e.g., a silicon semiconductor wafer, a wafer and a mask of silicon bromide or silicon chloride formed on top of the wafer, etc., is supported on the top surface 112 of the ESC 108. Integrated circuits, e.g., application specific integrated circuit (ASIC), programmable logic device (PLD), etc. are developed on the workpiece 110 and the integrated circuits are used in a variety of devices, e.g., cell phones, tablets, smart phones, computers, laptops, networking equipment, etc. Also, each of the lower electrode and the upper electrode is made of a metal, e.g., aluminum, alloy of aluminum, etc.

In some embodiments, the gas distribution plate 106 includes gas inlets, e.g., holes, etc., that are coupled to a central gas feed (not shown). The central gas feed receives one or more process gases from a gas supply (not shown). Examples of the process gases include an oxygen-containing gas, such as $O_2$. Other examples of the process gases include a fluorine-containing gas, e.g., tetrafluoromethane ($CF_4$), sulfur hexafluoride ($SF_6$), hexafluoroethane ($C_2F_6$), etc.

The surface antenna 104 is coupled to a sinusoidal RF generator 114 via an impedance matching circuit 115. The impedance matching circuit 115 is coupled to the sinusoidal RF generator 114 and is also coupled to the surface antenna 104. The impedance matching circuit 115 matches an impedance of a source with an impedance of a load. For example, the impedance matching circuit 115 matches an impedance of the sinusoidal RF generator 114 and an RF cable 117 that couples the sinusoidal RF generator 114 to the impedance matching circuit 115 with that of an impedance of the plasma chamber 102 and an RF transmission line 119 that couples the impedance matching circuit 115 to the plasma chamber 102.

Moreover, the ESC 108 is coupled to a filter 116. Examples of a filter include a linear filter, a non-linear filter, a time-invariant filter, a time variant filter, an analog filter, a digital filter, a discrete-time filter, a continuous-time filter, a passive filter, an active filter, an infinite impulse response filter, a finite impulse response filter, etc. Some examples of linear filters include low-pass filter, band-pass filter, high-pass filter, band-stop filter, all-pass filter, notch filter, comb filter, etc. Some examples of the linear continuous-time filters include Chebyshev filter, Butterworth filter, Bessel filter, Elliptic filter, etc.

In some embodiments, a filter is a device or process that removes from a signal received by the filter some unwanted component or feature. Filtering is a class of signal processing, the defining feature of filters being the complete or partial suppression of some parameter, e.g., frequency, magnitude, etc., of a signal received.

The filter 116 is coupled to a power amplifier 118, which is coupled to a nonsinusoidal RF generator 120.

The nonsinusoidal RF generator 120 and the sinusoidal RF generator 114 are coupled to a control system 122. An example of the control system 122 includes a computer. The control system 122 includes a processor 126 and a memory device 128. The processor 126 is coupled to the memory device 128. Examples of the memory device 128 include a random access memory (RAM) and a read-only memory (ROM). The memory device 128 may be a flash memory, a hard disk, a storage device, a computer-readable medium, etc. The processor 126 may be a microprocessor, or a central processing unit (CPU), or an ASIC, or a PLD, etc.

The control system 122 includes a recipe 124 that is stored within the memory device 128. The processor 126 executes the recipe 124 to create a condition within the plasma chamber 102. The recipe 124 is further described below. Examples of the condition associated with the recipe 124 include a pressure within the plasma chamber 102, a temperature within the plasma chamber 102, a gap between the upper electrode and the ESC 108, a frequency of operation of the nonsinusoidal RF generator 120, a frequency of operation of the sinusoidal RF generator 114, identification of one or more process gases to be supplied within the plasma chamber 102, or a combination thereof, etc.

The nonsinusoidal RF generator 120 generates a nonsinusoidal RF signal 130 having a frequency of operation received from the processor 126 and provides the nonsinusoidal RF signal 130 to the power amplifier 118. In some embodiments, the processor 126 provides a power profile, e.g., power magnitude as a function of time, etc., to the nonsinusoidal RF generator 120 and the nonsinusoidal RF generator 120 generates the nonsinusoidal RF signal 130 having the power profile. It should be noted that power magnitude as a function of time includes a frequency of the nonsinusoidal RF signal 130.

The power amplifier 118 receives the nonsinusoidal RF signal 130 and amplifies the nonsinusoidal RF signal 130 to generate an amplified nonsinusoidal RF signal 132. For example, the power amplifier 118 increases a magnitude of power of the nonsinusoidal RF signal 130 to generate the amplified nonsinusoidal RF signal 132.

In various embodiments, a shape of a nonsinusoidal RF signal that is generated by a nonsinusoidal RF generator is the same as a shape of an amplified nonsinusoidal RF signal generated from the nonsinusoidal RF signal and the amplified nonsinusoidal RF signal has a higher power magnitude than a power magnitude of the nonsinusoidal RF signal.

In some embodiments, a peak magnitude, e.g., peak power magnitude, peak power amplitude, etc., of an amplified sinusoidal RF signal is greater than a peak magnitude of a nonsinusoidal RF signal from which the amplified sinusoidal RF signal is generated.

In a number of embodiments, the processor 126 provides amplification parameters, e.g., amplification ratio, amplification factor, amplification power, etc., to a power amplifier and the power amplifier applies the amplification parameters to a nonsinusoidal RF signal received by the power amplifier to amplify the nonsinusoidal RF signal. In these embodiments, the power amplifier is coupled to the processor 126.

The filter 116 filters the amplified sinusoidal RF signal 132 by using a filtering signal 134 to generate a filtered nonsinusoidal RF signal 136.

In a number of embodiments, the processor 126 provides filter parameters, e.g., power magnitude, etc., to a filter and the filter applies the filter parameters to an amplified nonsinusoidal RF signal to filter the amplified nonsinusoidal RF signal. In these embodiments, the filter is coupled to the processor 126.

In various embodiments, the filtered nonsinusoidal RF signal 136 is a pulsed waveform that has a duty cycle that ranges from 10% to 90%. In some embodiments, the filtered nonsinusoidal RF signal 136 is a pulsed waveform that has a duty cycle that ranges from 1% to 99%. In some embodiments, the duty cycle of the filtered nonsinusoidal RF signal 136 is the same as the duty cycle of the filtering signal 134.

In these embodiments, the filtered nonsinusoidal RF signal 136 is a pulsed waveform having an on cycle and an off cycle.

During an on cycle, a signal has a magnitude, e.g., power amplitude, etc., other than zero, e.g., greater than zero, less than zero, etc., and during an off duty cycle the signal has a magnitude of zero. It should be noted that in some embodiments, a pulsed waveform has a magnitude, e.g., amplitude, etc., of zero during an off cycle and a magnitude other than zero during an on cycle.

The filtered nonsinusoidal RF signal 136 is provided by the filter 116 to the lower electrode of the ESC 108. Moreover, the sinusoidal RF generator 114 generates a sinusoidal RF signal and provides the sinusoidal RF signal to the surface antenna 104. In some embodiments, the processor 126 provides a frequency of the sinusoidal RF signal and power of the sinusoidal RF signal to the sinusoidal RF generator 114 and the sinusoidal RF generator 114 generates the sinusoidal RF signal having the power and the frequency.

In some embodiments, the frequency of operation of the nonsinusoidal RF generator 120 is the same as the frequency of operation of the sinusoidal RF generator 114. For example, the frequency of operation of the nonsinusoidal RF generator 120 ranges between 13 MHz and 14 MHz. As another example, the frequency of operation of the nonsinusoidal RF generator 120 is less than 13 MHz. As another example, the frequency of the nonsinusoidal RF signal 130 is the same as the frequency of the sinusoidal RF signal that is generated by the sinusoidal RF generator 114.

In several embodiments, the frequency of operation of the nonsinusoidal RF generator 120 is different from the frequency of operation of the sinusoidal RF generator 114.

When one or more of the process gases are supplied via the gas distribution plate 106 in a space of the plasma chamber 102 between the surface antenna 104 and the ESC 108, and when the sinusoidal RF signal is supplied to the surface antenna 104, and when the filtered nonsinusoidal RF signal 136 is supplied to the lower electrode of the ESC 108, the one or more process gases are ignited to generate plasma within the plasma chamber 102 and to achieve an ion energy 674 that is linked with a power profile of the recipe 124. The ion energy 674 and the power profile of the recipe 124 are further described below. The plasma is used to process, e.g., etch, sputter, etc., the workpiece 110.

In some embodiments, instead of the ion energy 674, an ion energy between a lower threshold and an upper threshold is linked to the power profile of the recipe 124 for achievement. The lower threshold is a lower value of an ion energy and the upper threshold is an upper value of the ion energy. The upper value is greater than the lower value.

In some embodiments, a power profile, and/or amplification parameters, and/or filter parameters are parts of a recipe.

Figure 1B:
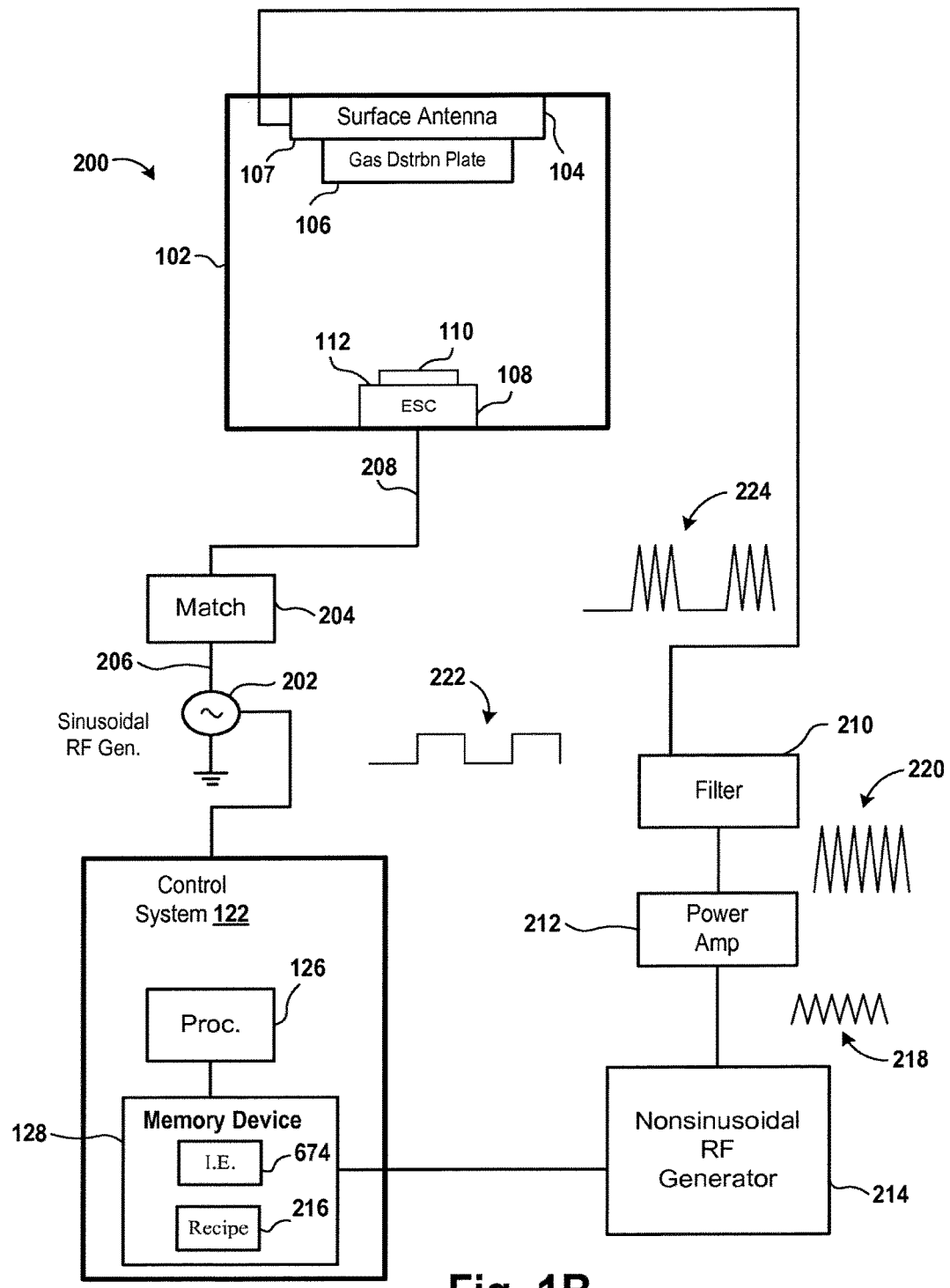
FIG. 1B a block diagram of an embodiment of a system for controlling ion energy within the plasma chamber by providing a nonsinusoidal RF signal to a surface antenna of the plasma chamber.

FIG. 1B a block diagram of an embodiment of a system 200 for controlling ion energy within the plasma chamber 102 by providing a nonsinusoidal RF signal to the surface antenna 104.

The ESC 108 is coupled to a sinusoidal RF generator 202 via an impedance matching circuit 204. The impedance matching circuit 204 matches an impedance of a source with an impedance of a load. For example, the impedance matching circuit 204 matches an impedance of the sinusoidal RF generator 202 and an RF cable 206 that couples the sinusoidal RF generator 202 to the impedance matching circuit 204 with that of an impedance of the plasma chamber 102 and an RF transmission line 208 that couples the impedance matching circuit 204 to the plasma chamber 102.

The surface antenna 104 is coupled to a filter 210. The filter 210 is coupled to a power amplifier 212, which is coupled to a nonsinusoidal RF generator 214. The nonsinusoidal RF generator 214 and the sinusoidal RF generator 202 are coupled to the control system 122.

The processor 126 executes a recipe 216 to create a condition within the plasma chamber 102. The recipe 216 is further described below. Examples of the condition associated with the recipe 216 include a pressure within the plasma chamber 102, a temperature within the plasma chamber 102, a gap between the upper electrode and the ESC 108, a frequency of operation of the nonsinusoidal RF generator 214, a frequency of operation of the sinusoidal RF generator 202, identification of one or more process gases to be supplied within the plasma chamber 102, or a combination thereof, etc.

The nonsinusoidal RF generator 214 generates a nonsinusoidal RF signal 218 having a frequency of operation received from the processor 126 and provides the nonsinusoidal RF signal 218 to the power amplifier 212. In some embodiments, the processor 126 provides a power profile, e.g., power magnitude as a function of time, etc., to the nonsinusoidal RF generator 214 and the nonsinusoidal RF generator 214 generates the nonsinusoidal RF signal 218 having the power profile. It should be noted that power magnitude as a function of time includes a frequency of the nonsinusoidal RF signal 218.

In a number of embodiments, a power profile that is provided by the processor 126 to the nonsinusoidal RF generator 120 (FIG. 1A) is different than a power profile that is provided by the processor 126 to the nonsinusoidal RF generator 214. For example, a sawtooth-shaped power profile is provided to the nonsinusoidal RF generator 120 and a pulsed power profile is provided to the nonsinusoidal RF generator 214. As another example, a peak magnitude of the power profile provided to the nonsinusoidal RF generator 120 is different than a peak magnitude of the power profile provided to the nonsinusoidal RF generator 214. As yet another example, the power profile provided to the nonsinusoidal RF generator 120 has a different phase than that of the power profile provided to the nonsinusoidal RF generator 214.

In several embodiments, the power profile that is provided to the nonsinusoidal RF generator 120 is the same as that of the power profile that is provided to the nonsinusoidal RF generator 214.

The power amplifier 212 receives the nonsinusoidal RF signal 218 and amplifies the nonsinusoidal RF signal 218 to generate an amplified nonsinusoidal RF signal 220. For example, the power amplifier 212 increases a magnitude of power of the nonsinusoidal RF signal 218 to generate the amplified nonsinusoidal RF signal 220.

In several embodiments, the power amplifier 212 applies a different amount of amplification to the nonsinusoidal RF signal 218 than that applied by the power amplifier 118 (FIG. 1A) to the nonsinusoidal RF signal 130 (FIG. 1A). For example, the power amplifier 212 applies an amplification ratio of x1:1 to the nonsinusoidal RF signal 130 and the power amplifier 118 applies an amplification ratio of x2:1 to the nonsinusoidal RF signal 130, where x1 and x2 are real numbers greater than zero. In some embodiments, x2 is greater than x1 and in other embodiments, x2 is less than or equal to x1.

In a number of embodiments, the power amplifier 212 applies the same amount of amplification to the nonsinusoidal RF signal 218 as that applied by the power amplifier 118 to the nonsinusoidal RF signal 130.

The filter 210 filters the amplified sinusoidal RF signal 220 by using a filtering signal 222 to generate a filtered nonsinusoidal RF signal 224. In various embodiments, the filtered nonsinusoidal RF signal 224 is a pulsed waveform that has a duty cycle that ranges from 10% to 90%. In some embodiments, the filtered nonsinusoidal RF signal 224 is a pulsed waveform that has a duty cycle that ranges from 1% to 99%. In some embodiments, the duty cycle of the filtered nonsinusoidal RF signal 224 is the same as the duty cycle of the filtering signal 222.

In some embodiments, the filter 210 applies a different filter to the amplified nonsinusoidal RF signal 220 than that applied by the filter 116 to the amplified nonsinusoidal signal 132 (FIG. 1A). For example, the filter 210 applies a low-pass filter to the amplified nonsinusoidal RF signal 220 and the filter 116 applies a band-pass filter to the amplified nonsinusoidal signal 132. As another example, the filter 210 applies a notch filter to the amplified nonsinusoidal RF signal 220 and the filter 116 applies a comb filter to the amplified nonsinusoidal signal 132.

In a number of embodiments, the filter 210 applies the same filter to the amplified nonsinusoidal RF signal 220 as that applied by the filter 116 to the amplified nonsinusoidal signal 132.

The filtered nonsinusoidal RF signal 224 is provided by the filter 210 to the surface antenna 104. Moreover, the sinusoidal RF generator 202 generates a sinusoidal RF signal and provides the sinusoidal RF signal to the ESC 108 via the impedance matching circuit 204. In some embodiments, the processor 126 provides a frequency of the sinusoidal RF signal and power of the sinusoidal RF signal to the sinusoidal RF generator 202 and the sinusoidal RF generator 202 generates the sinusoidal RF signal having the power and the frequency.

In some embodiments, the frequency of operation of the nonsinusoidal RF generator 214 is the same as the frequency of operation of the sinusoidal RF generator 202. For example, the frequency of operation of the nonsinusoidal RF generator 214 ranges between 13 MHz and 14 MHz. As another example, the frequency of operation of the nonsinusoidal RF generator 214 is less than 13 MHz. As another example, the frequency of the nonsinusoidal RF signal 218 is the same as the frequency of the sinusoidal RF signal that is generated by the sinusoidal RF generator 202.

In several embodiments, the frequency of operation of the nonsinusoidal RF generator 214 is different from the frequency of operation of the sinusoidal RF generator 202.

When one or more of the process gases are supplied via the gas distribution plate 106 in a space of the plasma chamber 102 between the surface antenna 104 and the ESC 108, and when the sinusoidal RF signal is supplied to the ESC 108, and when the filtered nonsinusoidal RF signal 224 is supplied to the surface antenna 104, the one or more process gases are ignited to generate plasma within the plasma chamber 102 and to achieve the ion energy 674 that is linked with a power profile of the recipe 216. The power profile of the recipe 216 is further described below. The plasma is used to process, e.g., etch, sputter, etc., the workpiece 110.

In some embodiments, instead of the ion energy 674, an ion energy between a lower threshold and an upper threshold is linked to the power profile of the recipe 216. The lower threshold is a lower value of an ion energy and the upper threshold is an upper value of the ion energy. The upper value is greater than the lower value.

Figure 1C:
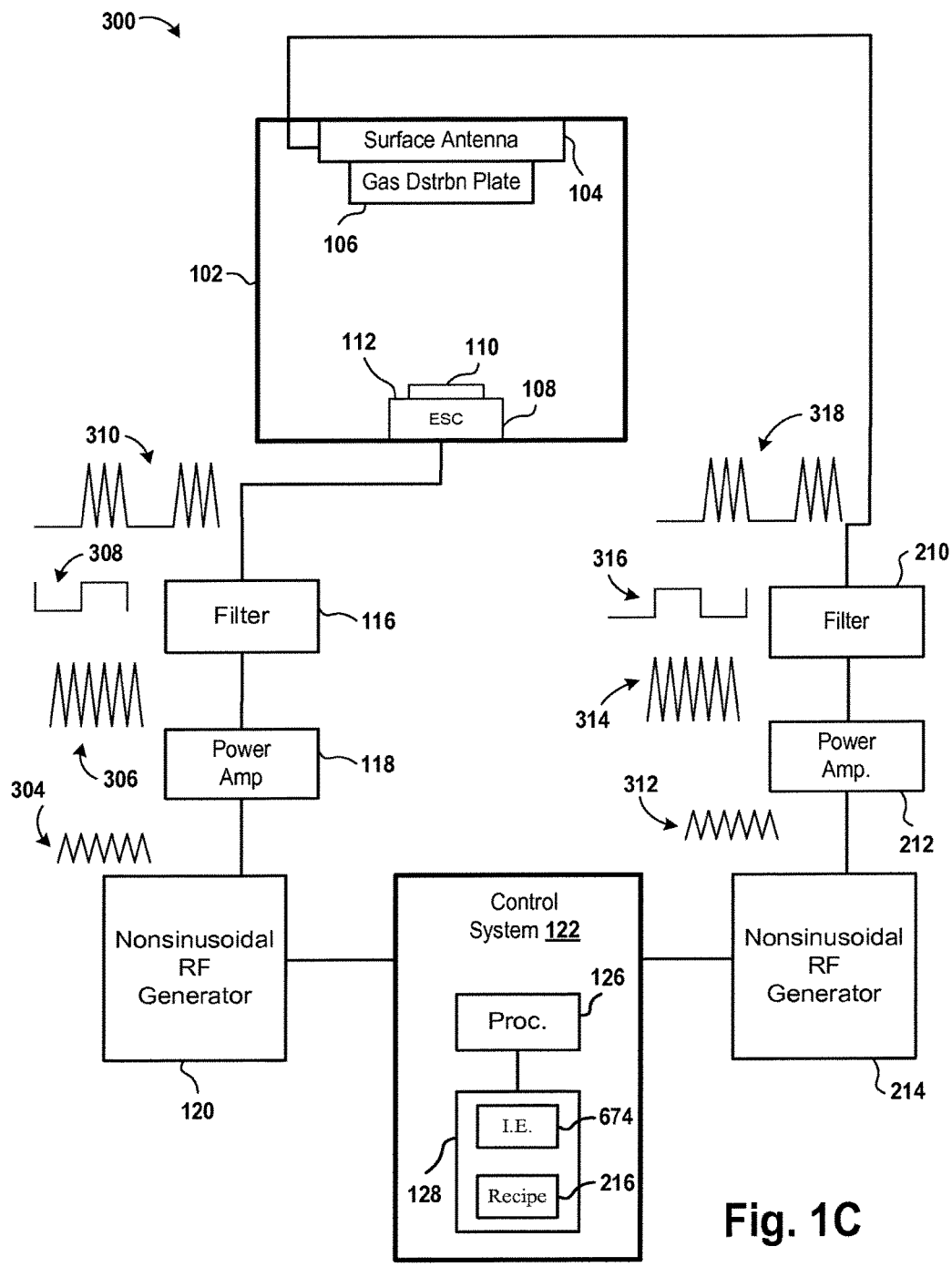
FIG. 1C is a block diagram of an embodiment of a system for controlling ion energy within the plasma chamber by providing a nonsinusoidal RF signal to the ESC and by providing a nonsinusoidal RF signal to the surface antenna.

FIG. 1C is a block diagram of an embodiment of a system 300 for controlling ion energy within the plasma chamber 102 by providing a nonsinusoidal RF signal to the ESC 108 and by providing a nonsinusoidal RF signal to the surface antenna 104.

The surface antenna 104 is coupled to the filter 210, which is coupled via the power amplifier 212 to the nonsinusoidal RF generator 214. Moreover, the ESC 108 is coupled to the filter 116, which is coupled via the power amplifier 118 to the nonsinusoidal RF generator 120.

The nonsinusoidal RF generators 120 and 214 are coupled to the control system 122. The control system 122 includes a recipe 302 that is stored within the memory device 128. The processor 126 executes the recipe 302 to create a condition within the plasma chamber 102. The recipe 302 is further described below. Examples of the condition associated with the recipe 302 include a pressure within the plasma chamber 102, a temperature within the plasma chamber 102, a gap between the upper electrode and the ESC 108, a frequency of operation of the nonsinusoidal RF generator 120, a frequency of operation of the nonsinusoidal RF generator 214, identification of one or more process gases to be supplied within the plasma chamber 102, or a combination thereof, etc.

The nonsinusoidal RF generator 120 generates a nonsinusoidal RF signal 304 having a frequency of operation received from the processor 126 and provides the nonsinusoidal RF signal 304 to the power amplifier 118. In some embodiments, the processor 126 provides a power profile, e.g., power magnitude as a function of time, etc., to the nonsinusoidal RF generator 120 to generate the nonsinusoidal RF signal 304 having the power profile. It should be noted that power magnitude as a function of time includes a frequency of the nonsinusoidal RF signal 304. The power amplifier 118 receives the nonsinusoidal RF signal 304 and amplifies the nonsinusoidal RF signal 304 to generate an amplified nonsinusoidal RF signal 306. For example, the power amplifier 118 increases a magnitude of power of the nonsinusoidal RF signal 304 to generate the amplified nonsinusoidal RF signal 306.

The filter 116 filters the amplified nonsinusoidal RF signal 306 by using a filtering signal 308 to generate a filtered nonsinusoidal RF signal 310. In various embodiments, the filtered nonsinusoidal RF signal 310 is a pulsed waveform that has a duty cycle that ranges from 10% to 90%. In some embodiments, the filtered nonsinusoidal RF signal 310 is a pulsed waveform that has a duty cycle that ranges from 1% to 99%. The filtered nonsinusoidal RF signal 310 is provided by the filter 116 to the ESC 112. In some embodiments, the duty cycle of the filtered nonsinusoidal RF signal 310 is the same as the duty cycle of the filtering signal 308.

Moreover, the nonsinusoidal RF generator 214 generates a nonsinusoidal RF signal 312 having a frequency of operation received from the processor 126 and provides the nonsinusoidal RF signal 312 to the power amplifier 212.

In some embodiments, the processor 126 provides a power profile, e.g., power magnitude as a function of time, etc., to the nonsinusoidal RF generator 214 to generate the nonsinusoidal RF signal 312 having the power profile. It should be noted that power magnitude as a function of time includes a frequency of the nonsinusoidal RF signal 312.

In some embodiments, the frequency of operation of the nonsinusoidal RF generator 214 is the same as the frequency of operation of the nonsinusoidal RF generator 120. As an example, the frequency of the nonsinusoidal RF signal 304 is the same as the frequency of the nonsinusoidal RF signal 312.

In several embodiments, the frequency of operation of the nonsinusoidal RF generator 214 is different from the frequency of operation of the nonsinusoidal RF generator 120.

The power amplifier 212 receives the nonsinusoidal RF signal 312 and amplifies the nonsinusoidal RF signal 312 to generate an amplified nonsinusoidal RF signal 314. For example, the power amplifier 212 increases a magnitude of power of the nonsinusoidal RF signal 312 to generate the amplified nonsinusoidal RF signal 314.

In several embodiments, the power amplifier 212 applies a different amount of amplification to the nonsinusoidal RF signal 312 than that applied by the power amplifier 118 (FIG. 1) to the nonsinusoidal RF signal 304. For example, the power amplifier 212 applies an amplification ratio of 2:1 to the nonsinusoidal RF signal 312 and the power amplifier 118 applies an amplification ratio of 3:1 to the nonsinusoidal RF signal 304.

In a number of embodiments, the power amplifier 212 applies the same amount of amplification to the nonsinusoidal RF signal 312 as that applied by the power amplifier 118 to the nonsinusoidal RF signal 304.

The filter 210 filters the amplified nonsinusoidal RF signal 314 by using a filtering signal 316 to generate a filtered nonsinusoidal RF signal 318. In various embodiments, the filtered nonsinusoidal RF signal 318 is a pulsed waveform that has a duty cycle that ranges from 10% to 90%. In some embodiments, the filtered nonsinusoidal RF signal 318 is a pulsed waveform that has a duty cycle that ranges from 1% to 99%. In some embodiments, the duty cycle of the filtered nonsinusoidal RF signal 318 is the same as the duty cycle of the filtering signal 316.

In several embodiments, the duty cycle of the filtered nonsinusoidal RF signal 318 is different from the duty cycle of the filtered nonsinusoidal RF signal 310. For example, the duty cycle of the filtered nonsinusoidal RF signal 318 is less than the duty cycle of the filtered nonsinusoidal RF signal 310. As another example, the duty cycle of the filtered nonsinusoidal RF signal 318 is greater than the duty cycle of the filtered nonsinusoidal RF signal 310. In a number of embodiments, the duty cycles of the filtered nonsinusoidal RF signals 310 and 318 are the same.

In some embodiments, the filter 210 applies a different filter to the amplified nonsinusoidal signal 314 than that applied by the filter 116 to the amplified nonsinusoidal signal 306. For example, the filter 210 applies a high-pass filter to the amplified nonsinusoidal signal 314 and the filter 116 applies a band-pass filter to the amplified nonsinusoidal signal 306. As another example, the filter 210 applies a low-pass filter to the amplified nonsinusoidal signal 314 and the filter 116 applies a comb filter to the amplified nonsinusoidal signal 306.

In a number of embodiments, the filter 210 applies the same filter to the amplified nonsinusoidal signal 314 as that applied by the filter 116 to the amplified nonsinusoidal signal 306.

The filtered nonsinusoidal RF signal 318 is provided by the filter 210 to the surface antenna 104 and the filtered nonsinusoidal RF signal 310 is provided by the filter 116 to the ESC 108. When one or more of the process gases are supplied via the gas distribution plate 106 in a space of the plasma chamber 102 between the surface antenna 104 and the ESC 108, and when the filtered nonsinusoidal RF signal 310 is supplied to the ESC 108, and when the filtered nonsinusoidal RF signal 318 is supplied to the surface antenna 104, the one or more process gases are ignited to generate plasma within the plasma chamber 102 and to achieve the ion energy 674 that is linked with a power profile of the recipe 302. The power profile of the recipe 302 is further described below. The plasma is used to process, e.g., etch, sputter, etc., the workpiece 110.

Figure 2A:
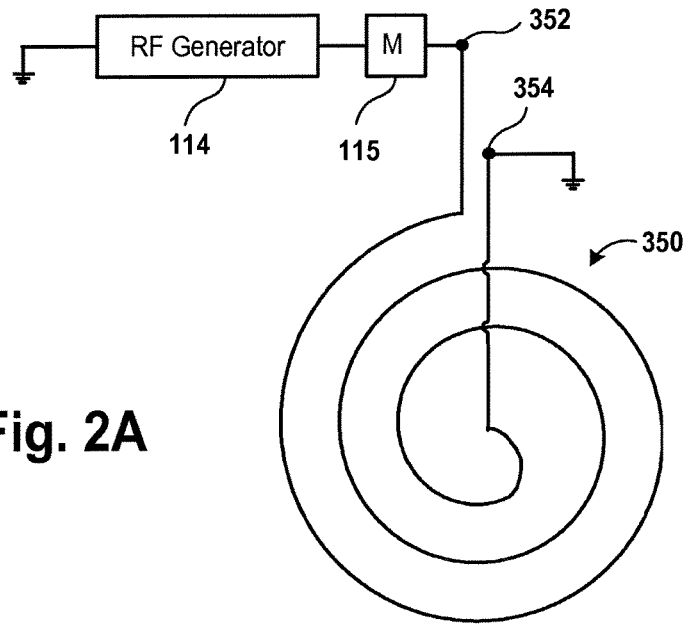
FIG. 2A is a diagram of an embodiment of an inductive coil that is an example of the surface antenna.

FIG. 2A is a diagram of an embodiment of an inductive coil 350 that is an example of the surface antenna 104 (FIGS. 1A thru 1C). The inductive coil 350 is coupled to the RF generator 114 at one end of the inductive coil 350 and is coupled to a ground connection at an opposite end 354 of the inductive coil 350.

Figure 2B:
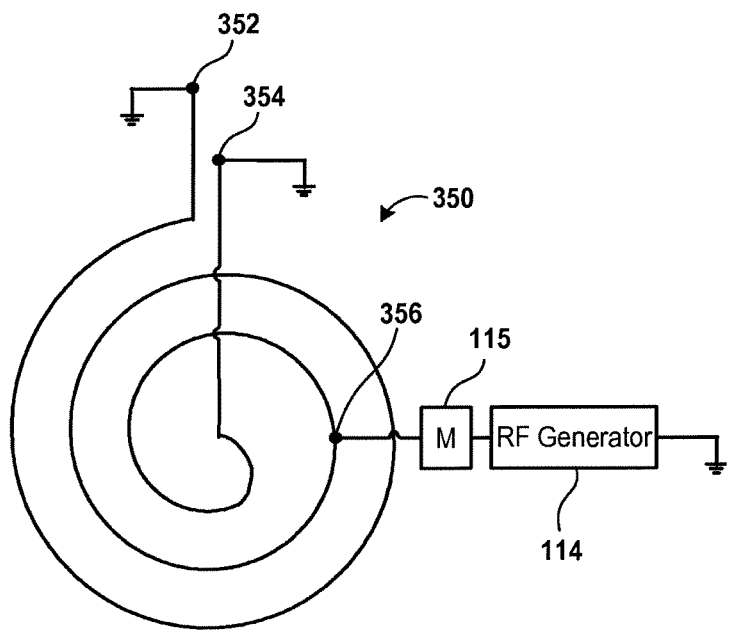
FIG. 2B is a diagram of an embodiment of the inductive coil that is coupled to ground connections at both ends of the inductive coil.

FIG. 2B is a diagram of an embodiment of the inductive coil 350 that is coupled to ground connections at both ends 352 and 354 of the inductive coil 350. The RF generator 114 is coupled the inductive coil 350 at a position 356 that is located between the two ends 352 and 354 of the inductive coil 350.

Figure 3A:
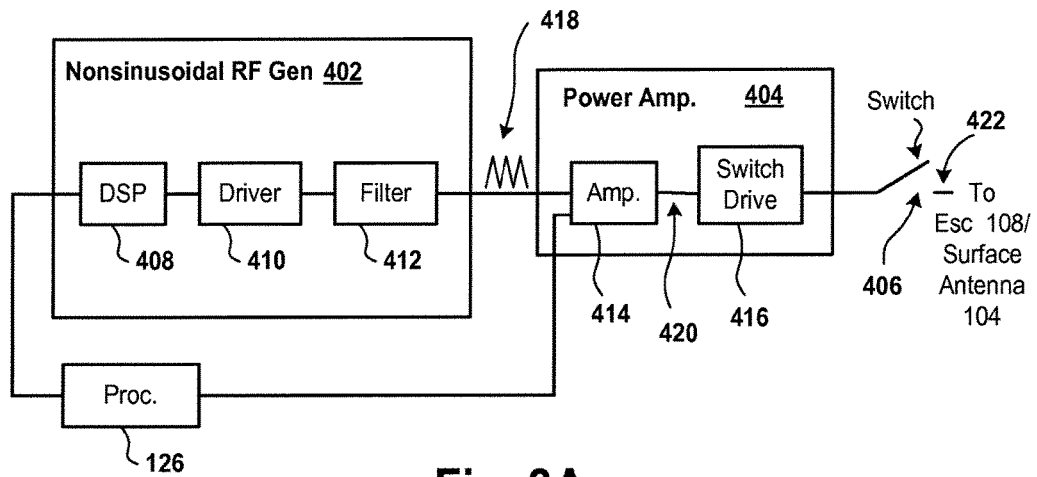
FIG. 3A is a diagram of an embodiment of a system for filtering a signal to provide a filtered signal to the ESC or to the surface antenna.

FIG. 3A is a diagram of an embodiment of a system 400 for filtering a signal to provide a filtered signal to the ESC 108 or to the surface antenna 104. The system 400 includes a nonsinusoidal RF generator 402, a power amplifier 404, and a switch 406.

The nonsinusoidal RF generator 402 is an example of the nonsinusoidal RF generator 120 (FIGS. 1A & 1C) and an example of the nonsinusoidal RF generator 214 (FIGS. 1B & 1C). The nonsinusoidal RF generator 402 is coupled to the power amplifier 404 and the power amplifier 404 is coupled to the switch 406.

Moreover, the power amplifier 404 is an example of the power amplifier 118 (FIGS. 1A & 1C) and of the power amplifier 212 (FIGS. 1B & 1C). The switch 406 is an example of the filter 116 (FIGS. 1A & 1C) and of the filter 210 (FIGS. 1B & 1C).

The nonsinusoidal RF generator 402 includes a digital signal processor (DSP) 408, a driver 410, and a filter 412. An example of the driver 410 includes one or more electronic oscillators. The DSP 408 is coupled to the driver 410 and the driver 410 is coupled to the filter 412.

The power amplifier 404 includes an amplifier 414 and a switch driver 416. The amplifier 414 is coupled to the switch driver 416 and to the processor 126. An example of the switch driver 416 includes one or more transistors.

The DSP 408 is coupled to the processor 126 (FIGS. 1A, 1B, & 1C) and receives commands from the processor 126. For example, the DSP 408 receives a frequency and/or power of an RF signal to be generated by the nonsinusoidal RF generator 402 from the processor 126.

The driver 410 generates a sinusoidal RF signal upon receiving a command from the DSP 408 to generate the sinusoidal RF signal. The filter 412 filters the sinusoidal RF signal generated by the driver 410 to generate a nonsinusoidal RF signal 418 that has the power and/or frequency that is received from the DSP 408. The nonsinusoidal RF signal 418 is an example of the nonsinusoidal RF signal 130 (FIG. 1A), the nonsinusoidal RF signal 218 (FIG. 1B), the nonsinusoidal RF signal 304 (FIG. 1C), and the nonsinusoidal RF signal 312 (FIG. 1C).

The amplifier 414 receives amplification parameters from the processor 126 and amplifies the nonsinusoidal RF signal 418 based on the amplification parameters to generate an amplified nonsinusoidal RF signal 420. The amplified nonsinusoidal RF signal 420 is sent via the switch drive 416 to the switch 406. The amplified nonsinusoidal RF signal 420 is an example of the amplified nonsinusoidal RF signal 132 (FIG. 1A), the amplified nonsinusoidal RF signal 220 (FIG. 1B), the amplified nonsinusoidal RF signal 306 (FIG. 1C), and the amplified nonsinusoidal RF signal 314 (FIG. 1C).

The switch drive 416 drives the switch 406 from an on position to an off position or from the off position to an on position to filter the amplified nonsinusoidal RF signal 420 to generate a filtered nonsinusoidal RF signal 422. The filtered nonsinusoidal RF signal 422 is an example of the filtered nonsinusoidal RF signal 136 (FIG. 1A), the filtered nonsinusoidal RF signal 224 (FIG. 1B), the filtered nonsinusoidal RF signal 310 (FIG. 1C), and the filtered nonsinusoidal RF signal 318 (FIG. 1C).

In some embodiments, the switch drive 416 receives the filter parameters and changes position of the switch 406 based on, e.g., to achieve, etc., the filter parameters. For example, when the filter parameters indicate that the filtered nonsinusoidal RF signal 422 be on for 60% of a clock cycle, the switch drive 416 closes the switch 406 for 60% of the clock cycle and opens the switch 406 for the remaining 40% of the clock cycle. As another example, when the filter parameters indicate that the filtered nonsinusoidal RF signal 422 be off for 40% of a clock cycle, the switch drive 416 opens the switch 406 for 40% of the clock cycle and closes the switch 406 for the remaining 60% of the clock cycle. In these embodiments, the switch drive 416 is coupled to the processor 126.

Figure 3B:
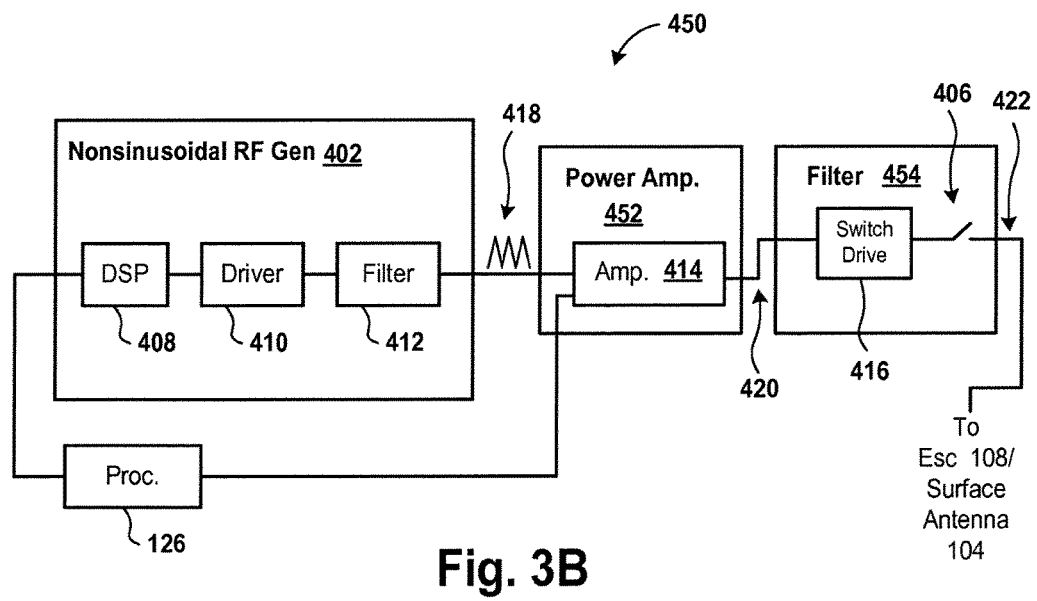
FIG. 3B is a diagram of an embodiment of a system for filtering a signal to provide a filtered signal to the ESC or to the surface antenna.

FIG. 3B is a diagram of an embodiment of a system 450 for filtering a signal to provide a filtered signal to the ESC 108 or to the surface antenna 104. The system 450 includes the nonsinusoidal RF generator 402, a power amplifier 452, and a filter 454. The system 450 is the same as the system 400 (FIG. 3A) except that the power amplifier 452 includes the amplifier 414 and excludes the switch driver 416 and except that the filter 454 includes the switch driver 416 and the switch 406. The system 450 functions in a manner similar to the system 400, which is described above.

Figure 4A:
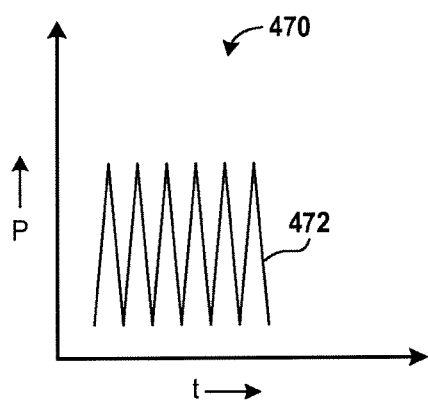
FIG. 4A is a graph of an embodiment of a saw-tooth shaped nonsinusoidal RF signal.

FIG. 4A is a graph 470 of an embodiment of a nonsinusoidal RF signal 472. The nonsinusoidal RF signal 472 is an example of the nonsinusoidal RF signal 130 (FIG. 1A), the nonsinusoidal RF signal 218 (FIG. 1B), the nonsinusoidal RF signal 304 (FIG. 1C), and the nonsinusoidal RF signal 312 (FIG. 1C).

The graph 470 plots power P of the nonsinusoidal RF signal 472 versus time t. The nonsinusoidal RF signal 472 is a sawtooth waveform in which each tooth is symmetrical with respect to a vertical y-axis, in which one line of a tooth forms an acute angle with respect to a horizontal x-axis and another line of the tooth forms an obtuse angle with respect to the horizontal x-axis.

Figure 4B:
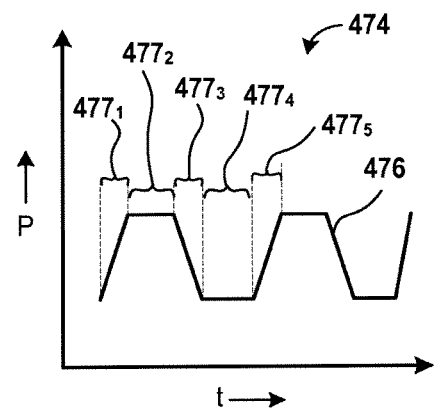
FIG. 4B is a graph of an embodiment of a nonsinusoidal RF signal.

FIG. 4B is a graph 474 of an embodiment of a nonsinusoidal RF signal 476. The nonsinusoidal RF signal 476 is an example of the nonsinusoidal RF signal 130 (FIG. 1A), the nonsinusoidal RF signal 218 (FIG. 1B), the nonsinusoidal RF signal 304 (FIG. 1C), and the nonsinusoidal RF signal 312 (FIG. 1C).

The graph 474 plots power P of the nonsinusoidal RF signal 476 versus time t. The nonsinusoidal RF signal 476 is a rectified waveform in which each portion of the nonsinusoidal RF signal 476 is a straight line. For example, each portion $477_1$, $477_2$, $477_3$, $477_4$, and $477_5$ of the nonsinusoidal RF signal 476 is a straight line.

Figure 4C:
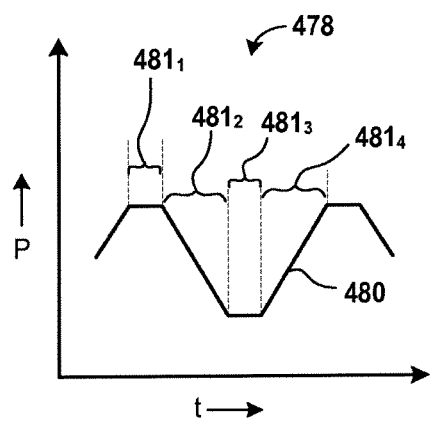
FIG. 4C is a graph of an embodiment of a nonsinusoidal RF signal that includes one or more curved portions.

FIG. 4C is a graph 478 of an embodiment of a nonsinusoidal RF signal 480. The nonsinusoidal RF signal 480 is an example of the nonsinusoidal RF signal 130 (FIG. 1A), the nonsinusoidal RF signal 218 (FIG. 1B), the nonsinusoidal RF signal 304 (FIG. 1C), and the nonsinusoidal RF signal 312 (FIG. 1C).

The graph 478 plots power P of the nonsinusoidal RF signal 480 versus time t. The nonsinusoidal RF signal 480 is a rectified waveform in which some portions of the nonsinusoidal RF signal 480 are straight lines and remaining portions of the nonsinusoidal RF signal 480 are curved. For example, portions $481_1$ and $481_3$ of the nonsinusoidal RF signal 480 are straight lines and portions $481_2$ and $481_4$ of the nonsinusoidal RF signal 480 are curved. For example, the nonsinusoidal RF signal 480 is generated by clipping a top and a bottom portion of a sinusoidal signal that is generated by an electronic oscillator.

Figure 4D:
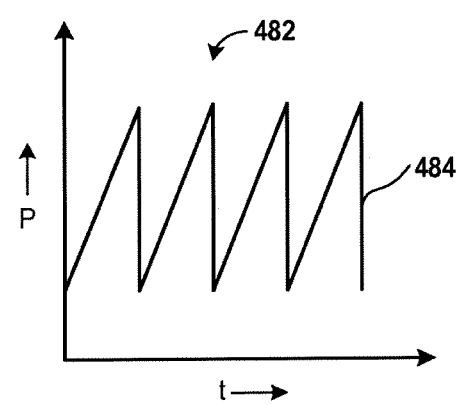
FIG. 4D is a graph of an embodiment of another saw-tooth shaped nonsinusoidal RF signal.

FIG. 4D is a graph 482 of an embodiment of a nonsinusoidal RF signal 484. The nonsinusoidal RF signal 484 is an example of the nonsinusoidal RF signal 130 (FIG. 1A), the nonsinusoidal RF signal 218 (FIG. 1B), the nonsinusoidal RF signal 304 (FIG. 1C), and the nonsinusoidal RF signal 312 (FIG. 1C).

The graph 482 plots power P of the nonsinusoidal RF signal 484 versus time t. The nonsinusoidal RF signal 484 is a sawtooth waveform in which each tooth is asymmetrical with respect to the vertical y-axis, in which one line of a tooth forms an acute angle with respect to the horizontal x-axis and another line of the tooth forms a right angle with respect to the horizontal x-axis.

Figure 4E:
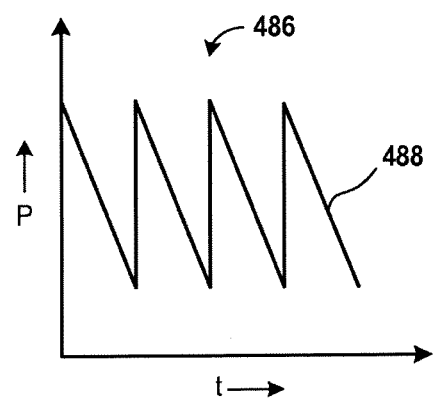
FIG. 4E is a graph of an embodiment of yet another saw-tooth shaped nonsinusoidal RF signal.

FIG. 4E is a graph 486 of an embodiment of a nonsinusoidal RF signal 488. The nonsinusoidal RF signal 488 is an example of the nonsinusoidal RF signal 130 (FIG. 1A), the nonsinusoidal RF signal 218 (FIG. 1B), the nonsinusoidal RF signal 304 (FIG. 1C), and the nonsinusoidal RF signal 312 (FIG. 1C).

The graph 486 plots power P of the nonsinusoidal RF signal 488 versus time t. The nonsinusoidal RF signal 488 is a sawtooth waveform in which each tooth is asymmetrical with respect to the vertical y-axis, in which one line of a tooth forms an obtuse angle with respect to the horizontal x-axis and another line of the tooth forms a right angle with respect to the horizontal x-axis.

Figure 4F:
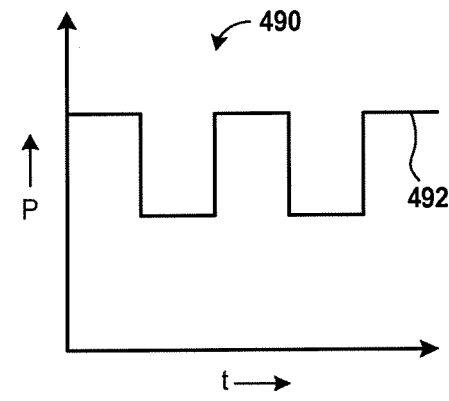
FIG. 4F is a graph of an embodiment of a pulsed nonsinusoidal RF signal.

FIG. 4F is a graph 490 of an embodiment of a nonsinusoidal RF signal 492. The nonsinusoidal RF signal 492 is an example of the nonsinusoidal RF signal 130 (FIG. 1A), the nonsinusoidal RF signal 218 (FIG. 1B), the nonsinusoidal RF signal 304 (FIG. 1C), and the nonsinusoidal RF signal 312 (FIG. 1C).

The graph 490 plots power P of the nonsinusoidal RF signal 492 versus time t. The nonsinusoidal RF signal 492 is a pulsed waveform.

It should be noted that in graphs 470, 474, 478, 482, 486, and 490, power P is plotted on a y-axis and time t is plotted on an x-axis.

Figure 5:
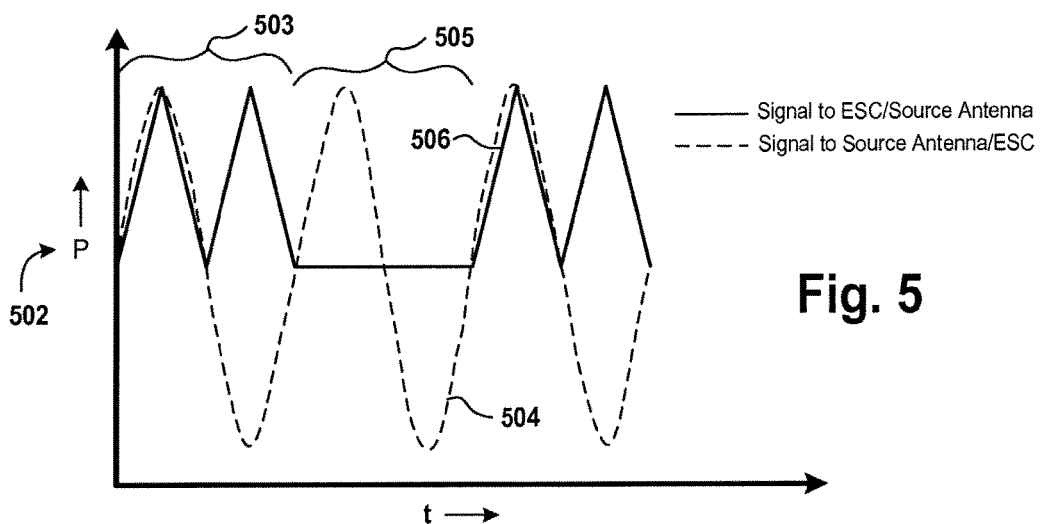
FIG. 5 is an embodiment of a graph that plots a sinusoidal signal that is generated by a sinusoidal RF generator of the system of FIG. 1A or by a sinusoidal RF generator of the system of FIG. 1B and that plots a filtered nonsinusoidal RF signal.

FIG. 5 is an embodiment of a graph 502 that plots a sinusoidal signal 504 that is generated by the sinusoidal RF generator 114 (FIG. 1A) or by the sinusoidal RF generator 202 (FIG. 1B) and that plots a filtered nonsinusoidal RF signal 506. The graph 502 plots power on a y-axis and time on an x-axis. The filtered nonsinusoidal RF signal 506 is an example of a signal that is provided as an output by a filter. For example, instead of the nonsinusoidal RF signal 136 (FIG. 1A), the filtered nonsinusoidal RF signal 506 is provided as an output from the filter 116 (FIG. 1A). As another example, instead of the nonsinusoidal RF signal 224 (FIG. 1B), the filtered nonsinusoidal RF signal 506 is provided as an output from the filter 210 (FIG. 1B). As yet another example, instead of the nonsinusoidal RF signal 310 (FIG. 1C), the filtered nonsinusoidal RF signal 506 is provided as an output from the filter 116 (FIG. 1C). As another example, instead of the nonsinusoidal RF signal 318 (FIG. 1C), the filtered nonsinusoidal RF signal 506 is provided as an output from the filter 210 (FIG. 1C). It should be noted that in some embodiments, a power level of a signal, e.g., the signal 504, etc., provided to the surface antenna 104 (FIGS. 1A-1C) and a power level of a signal, e.g., the signal 506, etc., provided to the ESC 108 (FIGS. 1A-1C) may be different.

It should be noted that when the sinusoidal signal 504 is supplied to the surface antenna 104 (FIG. 1A), the filtered nonsinusoidal RF signal 506 is provided to the ESC 108 (FIG. 1A). Moreover, when the sinusoidal signal 504 is supplied to the ESC 108 (FIG. 1B), the filtered nonsinusoidal RF signal 506 is provided to the surface antenna 104 (FIG. 1B).

The filtered nonsinusoidal RF signal 506 includes an unfiltered portion 503 and a filtered portion 505. For example, the unfiltered portion 503 is an example of an amplified nonsinusoidal signal that is provided as an output by the power amplifier 118 (FIGS. 1A & 1C) or the power amplifier 212 (FIGS. 1B & 1C). In some embodiments, a frequency of the sinusoidal signal 504 is the same as a frequency of the unfiltered portion 503.

Figure 6A:
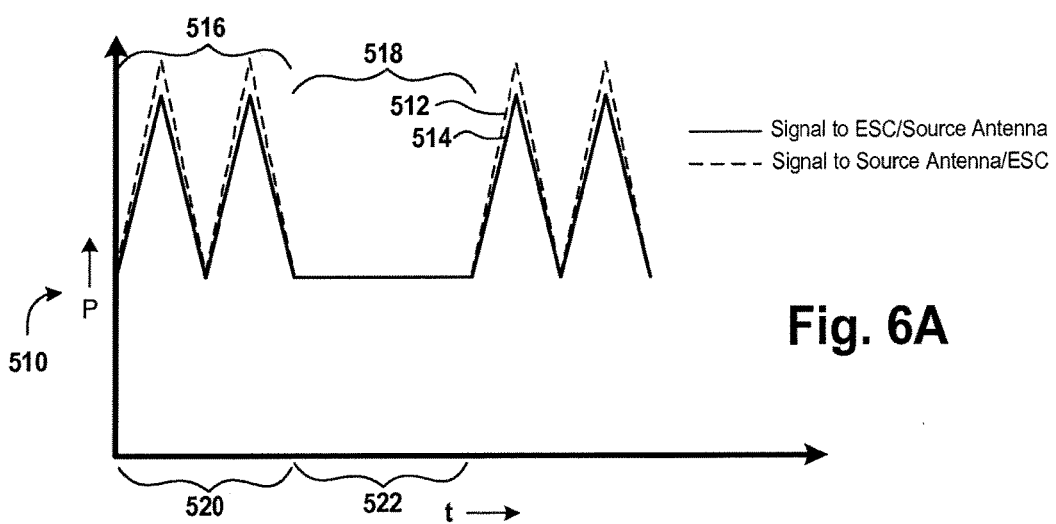
FIG. 6A is an embodiment of a graph that plots filtered nonsinusoidal signals having the same frequency.

FIG. 6A is an embodiment of a graph 510 that plots a filtered nonsinusoidal RF signal 512 and that plots a filtered nonsinusoidal RF signal 514. The graph 510 plots power on a y-axis and time on an x-axis. The filtered nonsinusoidal RF signal 512 is an example of a signal that is provided as an output by a filter and the filtered nonsinusoidal RF signal 514 is an example of a signal that is provided as an output by another filter. For example, instead of the filtered nonsinusoidal RF signal 136 (FIG. 1A), the filtered nonsinusoidal RF signal 512 is provided as an output from the filter 116 (FIG. 1A) and instead of the filtered nonsinusoidal RF signal 224 (FIG. 1B), the filtered nonsinusoidal RF signal 514 is provided as an output from the filter 210 (FIG. 1B). As another example, instead of the filtered nonsinusoidal RF signal 136 (FIG. 1A), the filtered nonsinusoidal RF signal 514 is provided as an output from the filter 116 (FIG. 1A) and instead of the filtered nonsinusoidal RF signal 224 (FIG. 1B), the filtered nonsinusoidal RF signal 512 is provided as an output from the filter 210 (FIG. 1B). As another example, instead of the filtered nonsinusoidal RF signal 310 (FIG. 1C), the filtered nonsinusoidal RF signal 512 is provided as an output from the filter 116 (FIG. 1C) and instead of the filtered nonsinusoidal RF signal 318 (FIG. 1C), the filtered nonsinusoidal RF signal 514 is provided as an output from the filter 210 (FIG. 1C). As yet another example, instead of the filtered nonsinusoidal RF signal 310 (FIG. 1C), the filtered nonsinusoidal RF signal 514 is provided as an output from the filter 116 (FIG. 1C) and instead of the filtered nonsinusoidal RF signal 318 (FIG. 1C), the filtered nonsinusoidal RF signal 512 is provided as an output from the filter 210 (FIG. 1C).

The filtered nonsinusoidal RF signal 512 includes an unfiltered portion 516 and a filtered portion 518. For example, the unfiltered portion 516 is an example of an amplified nonsinusoidal signal that is provided as an output by the power amplifier 118 (FIGS. 1A & 1C) or the power amplifier 212 (FIGS. 1B & 1C). Moreover, the filtered nonsinusoidal RF signal 514 includes an unfiltered portion 520 and a filtered portion 522. For example, the unfiltered portion 520 is an example of an amplified nonsinusoidal signal that is provided as an output by the power amplifier 118 (FIGS. 1A & 1C) or the power amplifier 212 (FIGS. 1B & 1C).

It should be noted that a frequency of the unfiltered portion 516 is the same as a frequency of the unfiltered portion 520 and a peak-to-peak amplitude of the unfiltered portion 516 is different from a peak-to-peak amplitude of the unfiltered portion 520. Also, a duty cycle of the unfiltered portion 516 is the same as a duty cycle of the unfiltered portion 520. Moreover, the filtered nonsinusoidal RF signal 512 is in phase with the filtered nonsinusoidal RF signal 514.

In some embodiments, a frequency of the unfiltered portion 516 is different from a frequency of the unfiltered portion 520. In various embodiments, a duty cycle of the unfiltered portion 516 is different than a duty cycle of the unfiltered portion 520. In a number of embodiments, a peak-to-peak amplitude of the unfiltered portion 516 is the same as a peak-to-peak amplitude of the unfiltered portion 520.

Figure 6B:
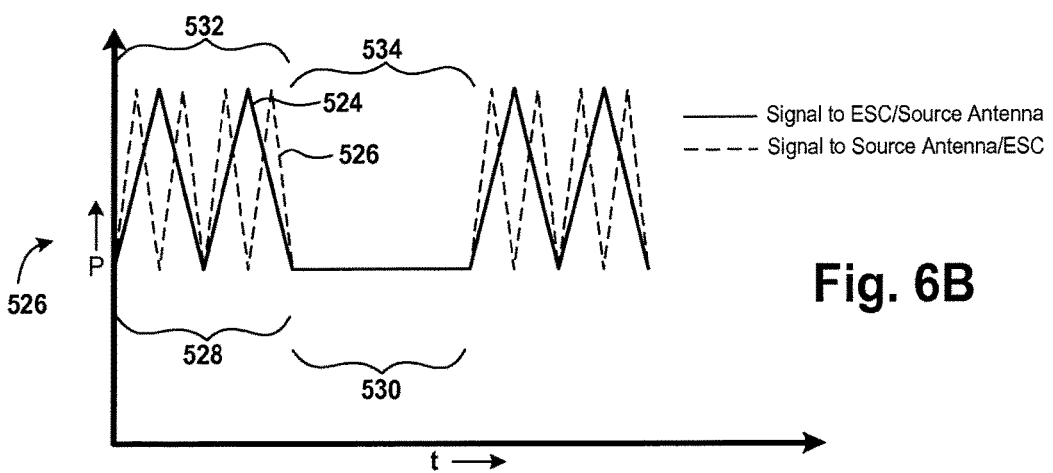
FIG. 6B is an embodiment of a graph that plots filtered nonsinusoidal signals having different frequencies.

FIG. 6B is an embodiment of a graph 526 that plots a filtered nonsinusoidal RF signal 524 and that plots a filtered nonsinusoidal RF signal 526. The graph 526 plots power on a y-axis and time on an x-axis. The filtered nonsinusoidal RF signal 524 is an example of a signal that is provided as an output by a filter and the filtered nonsinusoidal RF signal 526 is an example of a signal that is provided as an output by another filter. For example, instead of the filtered nonsinusoidal RF signal 136 (FIG. 1A), the filtered nonsinusoidal RF signal 524 is provided as an output from the filter 116 (FIG. 1A) and instead of the filtered nonsinusoidal RF signal 224 (FIG. 1B), the filtered nonsinusoidal RF signal 526 is provided as an output from the filter 210 (FIG. 1B). As another example, instead of the filtered nonsinusoidal RF signal 136 (FIG. 1A), the filtered nonsinusoidal RF signal 526 is provided as an output from the filter 116 (FIG. 1A) and instead of the filtered nonsinusoidal RF signal 224 (FIG. 1B), the filtered nonsinusoidal RF signal 524 is provided as an output from the filter 210 (FIG. 1B). As yet another example, instead of the filtered nonsinusoidal RF signal 310 (FIG. 1C), the filtered nonsinusoidal RF signal 524 is provided as an output from the filter 116 (FIG. 1C) and instead of the filtered nonsinusoidal RF signal 318 (FIG. 1C), the filtered nonsinusoidal RF signal 526 is provided as an output from the filter 210 (FIG. 1C). As another example, instead of the filtered nonsinusoidal RF signal 310 (FIG. 1C), the filtered nonsinusoidal RF signal 526 is provided as an output from the filter 116 (FIG. 1C) and instead of the filtered nonsinusoidal RF signal 318 (FIG. 1C), the filtered nonsinusoidal RF signal 524 is provided as an output from the filter 210 (FIG. 1C).

The filtered nonsinusoidal RF signal 524 includes an unfiltered portion 528 and a filtered portion 530. For example, the unfiltered portion 528 is an example of an amplified nonsinusoidal signal that is provided as an output by the power amplifier 118 (FIGS. 1A & 1C) or the power amplifier 212 (FIGS. 1B & 1C). Moreover, the filtered nonsinusoidal RF signal 526 includes an unfiltered portion 532 and a filtered portion 534. For example, the unfiltered portion 532 is an example of an amplified nonsinusoidal signal that is provided as an output by the power amplifier 118 (FIGS. 1A & 1C) or the power amplifier 212 (FIGS. 1B & 1C).

It should be noted that a frequency of the unfiltered portion 532 is different from a frequency of the unfiltered portion 528 and a peak-to-peak amplitude of the unfiltered portion 532 is the same as a peak-to-peak amplitude of the unfiltered portion 528. Also, a duty cycle of the unfiltered portion 528 is the same as a duty cycle of the unfiltered portion 532.

In some embodiments, a frequency of the unfiltered portion 528 is different from a frequency of the unfiltered portion 532. In various embodiments, a duty cycle of the unfiltered portion 528 is different from the duty cycle of the unfiltered portion 532. duty cycle of the unfiltered portion 532. In a number of embodiments, a peak-to-peak amplitude of the unfiltered portion 532 is different from a peak-to-peak amplitude of the unfiltered portion 528.

It should be noted that filtered portions of signals in graphs 502, 510, and 526 are a straight line. In several embodiments, a filtered portion of a filtered nonsinusoidal RF signal is curved, a straight line, a group of straight lines, or a combination thereof.

FIG. 6C is an embodiment of a graph 538 that plots a filtered nonsinusoidal RF signal 540 and that plots a filtered nonsinusoidal RF signal 542. The graph 538 plots power on a y-axis and time on an x-axis. The filtered nonsinusoidal RF signal 540 is an example of a signal that is provided as an output by a filter and the filtered nonsinusoidal RF signal 542 is an example of a signal that is provided as an output by another filter. For example, instead of the filtered nonsinusoidal RF signal 136 (FIG. 1A), the filtered nonsinusoidal RF signal 540 is provided as an output from the filter 116 (FIG. 1A) and instead of the filtered nonsinusoidal RF signal 224 (FIG. 1B), the filtered nonsinusoidal RF signal 542 is provided as an output from the filter 210 (FIG. 1B). As another example, instead of the filtered nonsinusoidal RF signal 136 (FIG. 1A), the filtered nonsinusoidal RF signal 542 is provided as an output from the filter 116 (FIG. 1A) and instead of the filtered nonsinusoidal RF signal 224 (FIG. 1B), the filtered nonsinusoidal RF signal 540 is provided as an output from the filter 210 (FIG. 1B). As another example, instead of the filtered nonsinusoidal RF signal 310 (FIG. 1C), the filtered nonsinusoidal RF signal 540 is provided as an output from the filter 116 (FIG. 1C) and instead of the filtered nonsinusoidal RF signal 318 (FIG. 1C), the filtered nonsinusoidal RF signal 542 is provided as an output from the filter 210 (FIG. 1C). As yet another example, instead of the filtered nonsinusoidal RF signal 310 (FIG. 1C), the filtered nonsinusoidal RF signal 542 is provided as an output from the filter 116 (FIG. 1C) and instead of the filtered nonsinusoidal RF signal 318 (FIG. 1C), the filtered nonsinusoidal RF signal 540 is provided as an output from the filter 210 (FIG. 1C).

The filtered nonsinusoidal RF signal 542 includes the unfiltered portion 516 and a filtered portion 546. Moreover, the filtered nonsinusoidal RF signal 540 includes the unfiltered portion 520 and a filtered portion 550.

It should be noted that each filtered portion 546 and 550 is not a straight line and is a combination, e.g., group, etc., of straight lines.

It is noted that a peak-to-peak amplitude of the filtered portion 546 is less than a peak-to-peak amplitude of the unfiltered portion 516. Moreover, a peak-to-peak amplitude of the filtered portion 550 is less than a peak-to-peak amplitude of the unfiltered portion 520. Also, a shape of the filtered portion 546 is different from a shape of the unfiltered portion 516. Moreover, a shape of the filtered portion 550 is different from a shape of the unfiltered portion 520.

It should further be noted that a frequency of the unfiltered portion 516 is the same as a frequency of the unfiltered portion 520. Moreover, a frequency of the filtered portion 546 is the same as a frequency of the filtered portion 550. Also, a duty cycle of the unfiltered portion 516 is different from a duty cycle of the unfiltered portion 520 and a duty cycle of the filtered portion 546 is different from as a duty cycle of the filtered portion 550. Moreover, a peak-to-peak amplitude of the filtered portion 546 is different from a peak-to-peak amplitude of the filtered portion 550. Moreover, the filtered nonsinusoidal RF signal 542 is in phase with the filtered nonsinusoidal RF signal 540.

In several embodiments, a peak-to-peak amplitude of the filtered portion 546 is the same as a peak-to-peak amplitude of the filtered portion 550. In some embodiments, a frequency of the filtered portion 546 is different from a frequency of the filtered portion 550. In a number of embodiments, a duty cycle of the filtered portion 546 is the same as a duty cycle of the filtered portion 550.

FIG. 6D is an embodiment of a graph 557 that plots a filtered nonsinusoidal RF signal 552 and that plots a filtered nonsinusoidal RF signal 554. The graph 557 plots power on a y-axis and time on an x-axis. The filtered nonsinusoidal RF signal 552 is an example of a signal that is provided as an output by a filter and the filtered nonsinusoidal RF signal 554 is an example of a signal that is provided as an output by another filter. For example, instead of the filtered nonsinusoidal RF signal 136 (FIG. 1A), the filtered nonsinusoidal RF signal 552 is provided as an output from the filter 116 (FIG. 1A) and instead of the filtered nonsinusoidal RF signal 224 (FIG. 1B), the filtered nonsinusoidal RF signal 554 is provided as an output from the filter 210 (FIG. 1B). As another example, instead of the filtered nonsinusoidal RF signal 136 (FIG. 1A), the filtered nonsinusoidal RF signal 554 is provided as an output from the filter 116 (FIG. 1A) and instead of the filtered nonsinusoidal RF signal 224 (FIG. 1B), the filtered nonsinusoidal RF signal 552 is provided as an output from the filter 210 (FIG. 1B). As another example, instead of the filtered nonsinusoidal RF signal 310 (FIG. 1C), the filtered nonsinusoidal RF signal 552 is provided as an output from the filter 116 (FIG. 1C) and instead of the filtered nonsinusoidal RF signal 318 (FIG. 1C), the filtered nonsinusoidal RF signal 554 is provided as an output from the filter 210 (FIG. 1C). As yet another example, instead of the filtered nonsinusoidal RF signal 310 (FIG. 1C), the filtered nonsinusoidal RF signal 554 is provided as an output from the filter 116 (FIG. 1C) and instead of the filtered nonsinusoidal RF signal 318 (FIG. 1C), the filtered nonsinusoidal RF signal 552 is provided as an output from the filter 210 (FIG. 1C).

The filtered nonsinusoidal RF signal 554 includes the unfiltered portion 532 and a filtered portion 558. Moreover, the filtered nonsinusoidal RF signal 552 includes the unfiltered portion 528 and a filtered portion 562.

It should be noted that the filtered portions 558 and 562 are not a straight line and are a combination, e.g., group, etc., of straight lines.

It is noted that a peak-to-peak amplitude of the filtered portion 558 is less than a peak-to-peak amplitude of the unfiltered portion 532. Moreover, a peak-to-peak amplitude of the filtered portion 562 is less than a peak-to-peak amplitude of the unfiltered portion 528. Also, a shape of the filtered portion 558 is different from a shape of the unfiltered portion 532. Moreover, a shape of the filtered portion 562 is different from a shape of the unfiltered portion 528.

It should further be noted that a frequency of the unfiltered portion 532 is different from a frequency of the unfiltered portion 528. Moreover, a frequency of the filtered portion 558 is also different from a frequency of the filtered portion 562. Also, a duty cycle of the unfiltered portion 532 is the same as a duty cycle of the unfiltered portion 528 and a duty cycle of the filtered portion 558 is the same as a duty cycle of the filtered portion 562. Moreover, a peak-to-peak amplitude of the filtered portion 558 is different from a peak-to-peak amplitude of the filtered portion 562.

In several embodiments, a peak-to-peak amplitude of the filtered portion 558 is the same as a peak-to-peak amplitude of the filtered portion 562. In some embodiments, a frequency of the filtered portion 558 is the same as a frequency of the filtered portion 562. In a number of embodiments, a duty cycle of the filtered portion 558 is different from a duty cycle of the filtered portion 562 and/or a duty cycle of the unfiltered portion 532 is different from a duty cycle of the unfiltered portion 528.

Figure 6E:
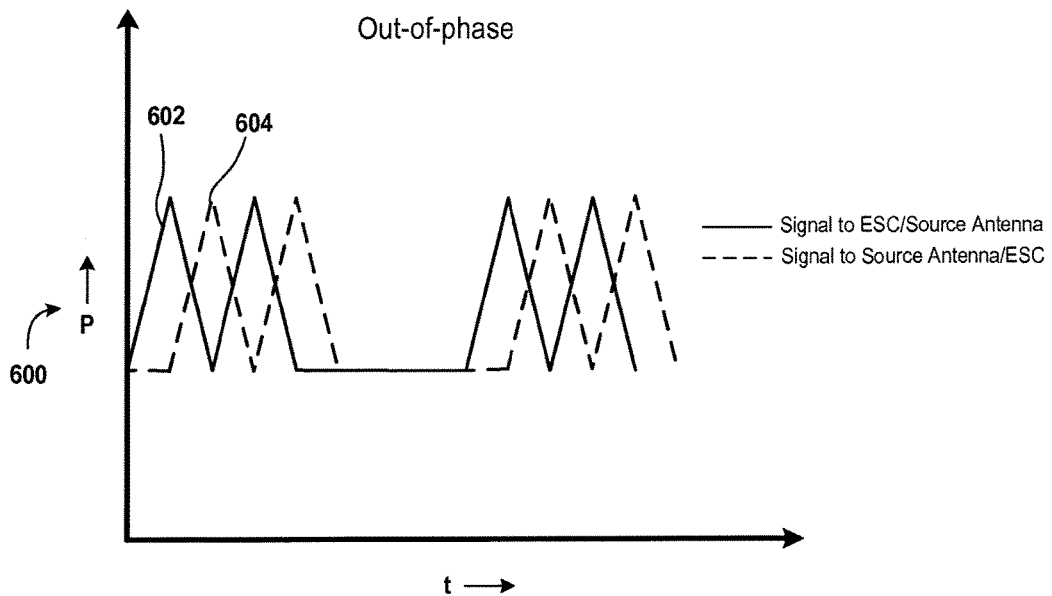
FIG. 6E is an embodiment of a graph that plots filtered nonsinusoidal signals that are out-of-phase with each other.

FIG. 6E is an embodiment of a graph 600 that plots a filtered nonsinusoidal RF signal 602 and that plots a filtered nonsinusoidal RF signal 604. The graph 600 plots power on a y-axis and time on an x-axis. The filtered nonsinusoidal RF signal 602 is an example of a signal that is provided as an output by a filter and the filtered nonsinusoidal RF signal 604 is an example of a signal that is provided as an output by another filter. For example, instead of the filtered nonsinusoidal RF signal 136 (FIG. 1A), the filtered nonsinusoidal RF signal 602 is provided as an output from the filter 116 (FIG. 1A) and instead of the filtered nonsinusoidal RF signal 224 (FIG. 1B), the filtered nonsinusoidal RF signal 604 is provided as an output from the filter 210 (FIG. 1B). As another example, instead of the filtered nonsinusoidal RF signal 136 (FIG. 1A), the filtered nonsinusoidal RF signal 604 is provided as an output from the filter 116 (FIG. 1A) and instead of the filtered nonsinusoidal RF signal 224 (FIG. 1B), the filtered nonsinusoidal RF signal 602 is provided as an output from the filter 210 (FIG. 1B). As another example, instead of the filtered nonsinusoidal RF signal 310 (FIG. 1C), the filtered nonsinusoidal RF signal 602 is provided as an output from the filter 116 (FIG. 1C) and instead of the filtered nonsinusoidal RF signal 318 (FIG. 1C), the filtered nonsinusoidal RF signal 604 is provided as an output from the filter 210 (FIG. 1C). As yet another example, instead of the filtered nonsinusoidal RF signal 318 (FIG. 1C), the filtered nonsinusoidal RF signal 602 is provided as an output from the filter 116 (FIG. 1C) and instead of the filtered nonsinusoidal RF signal 310 (FIG. 1C), the filtered nonsinusoidal RF signal 604 is provided as an output from the filter 210 (FIG. 1C).

The filtered nonsinusoidal RF signal 602 includes an unfiltered portion and a filtered portion. Moreover, the filtered nonsinusoidal RF signal 604 includes an unfiltered portion and a filtered portion.

It should be noted that the filtered nonsinusoidal RF signal 602 is out-of-phase with the filtered nonsinusoidal RF signal 604. Moreover, filtered nonsinusoidal RF signal 602 has the same peak-to-peak amplitude as that of the filtered nonsinusoidal RF signal 604.

It should be noted that the filtered portion of the filtered nonsinusoidal RF signal 602 is horizontally linear and the filtered portion of the filtered nonsinusoidal RF signal 604 is also horizontally linear.

In some embodiments, the filtered nonsinusoidal RF signal 602 has a different peak-to-peak amplitude as that of the filtered nonsinusoidal RF signal 604. In various embodiments, the filtered nonsinusoidal RF signal 602 is in-phase with the filtered nonsinusoidal RF signal 604.

Figure 6F:
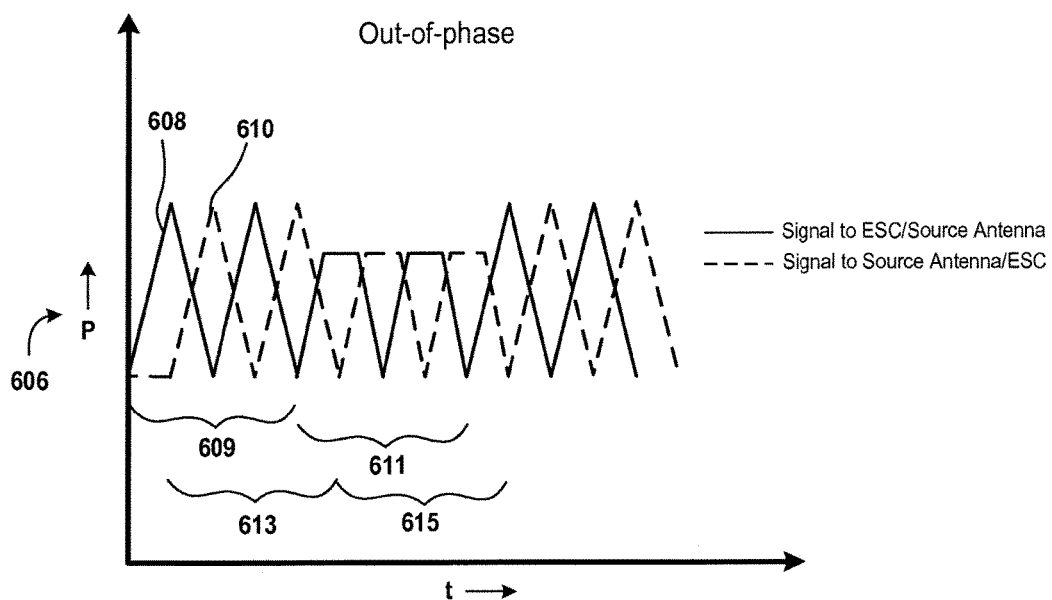
FIG. 6F is an embodiment of a graph that plots filtered nonsinusoidal signals that are out-of-phase with each other.

FIG. 6F is an embodiment of a graph 606 that plots a filtered nonsinusoidal RF signal 608 and that plots a filtered nonsinusoidal RF signal 610. The graph 606 plots power on a y-axis and time on an x-axis. The filtered nonsinusoidal RF signal 608 is an example of a signal that is provided as an output by a filter and the filtered nonsinusoidal RF signal 610 is an example of a signal that is provided as an output by another filter. For example, instead of the filtered nonsinusoidal RF signal 136 (FIG. 1A), the filtered nonsinusoidal RF signal 608 is provided as an output from the filter 116 (FIG. 1A) and instead of the filtered nonsinusoidal RF signal 224 (FIG. 1B), the filtered nonsinusoidal RF signal 610 is provided as an output from the filter 210 (FIG. 1B). As another example, instead of the filtered nonsinusoidal RF signal 136 (FIG. 1A), the filtered nonsinusoidal RF signal 610 is provided as an output from the filter 116 (FIG. 1A) and instead of the filtered nonsinusoidal RF signal 224 (FIG. 1B), the filtered nonsinusoidal RF signal 608 is provided as an output from the filter 210 (FIG. 1B). As another example, instead of the filtered nonsinusoidal RF signal 310 (FIG. 1C), the filtered nonsinusoidal RF signal 608 is provided as an output from the filter 116 (FIG. 1C) and instead of the filtered nonsinusoidal RF signal 318 (FIG. 1C), the filtered nonsinusoidal RF signal 610 is provided as an output from the filter 210 (FIG. 1C). As yet another example, instead of the filtered nonsinusoidal RF signal 318 (FIG. 1C), the filtered nonsinusoidal RF signal 610 is provided as an output from the filter 116 (FIG. 1C) and instead of the filtered nonsinusoidal RF signal 310 (FIG. 1C), the filtered nonsinusoidal RF signal 608 is provided as an output from the filter 210 (FIG. 1C).

The filtered nonsinusoidal RF signal 608 includes an unfiltered portion 609 and a filtered portion 611. Moreover, the filtered nonsinusoidal RF signal 610 includes an unfiltered portion 613 and a filtered portion 615.

It is noted that a peak-to-peak amplitude of the filtered portion 611 is less than a peak-to-peak amplitude of the unfiltered portion 609. Moreover, a peak-to-peak amplitude of the filtered portion 615 is less than a peak-to-peak amplitude of the unfiltered portion 613. Also, a shape of the filtered portion 611 is different from a shape of the unfiltered portion 609. Moreover, a shape of the filtered portion 615 is different from a shape of the unfiltered portion 613.

It should be noted that the filtered nonsinusoidal RF signal 608 is out-of-phase with the filtered nonsinusoidal RF signal 610. Moreover, filtered nonsinusoidal RF signal 608 has the same peak-to-peak amplitude as that of the filtered nonsinusoidal RF signal 610.

It should be noted that the filtered portion of the filtered nonsinusoidal RF signal 608 is formed of a combination of lines and the filtered portion of the filtered nonsinusoidal RF signal 604 is also formed of a combination of lines.

In some embodiments, the filtered portion of the filtered nonsinusoidal RF signal 608 is formed of one or more lines and one or more curves and the filtered portion of the filtered nonsinusoidal RF signal 604 is also formed of one or more lines and one or more curves.

Figure 7:
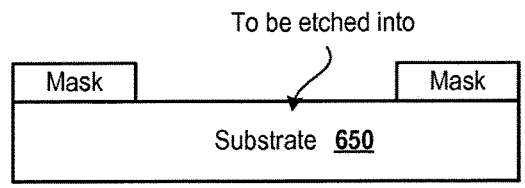
FIG. 7 is a diagram of an embodiment of a substrate with a mask layer on top of the substrate.

FIG. 7 is a diagram of an embodiment of a substrate 650 with a mask layer, e.g., silicon oxide, silicon nitride, etc., on top of the substrate 650. The substrate 650 includes a semiconductor, e.g., silicon, germanium, etc. The substrate 650 is to be etched using the plasma system 100 (FIG. 1A), plasma system 200 (FIG. 1B), or the plasma system 300 (FIG. 1C). The substrate 650 with the mask is an example of the workpiece 110 (FIGS. 1A thru 1C).

Figure 8:
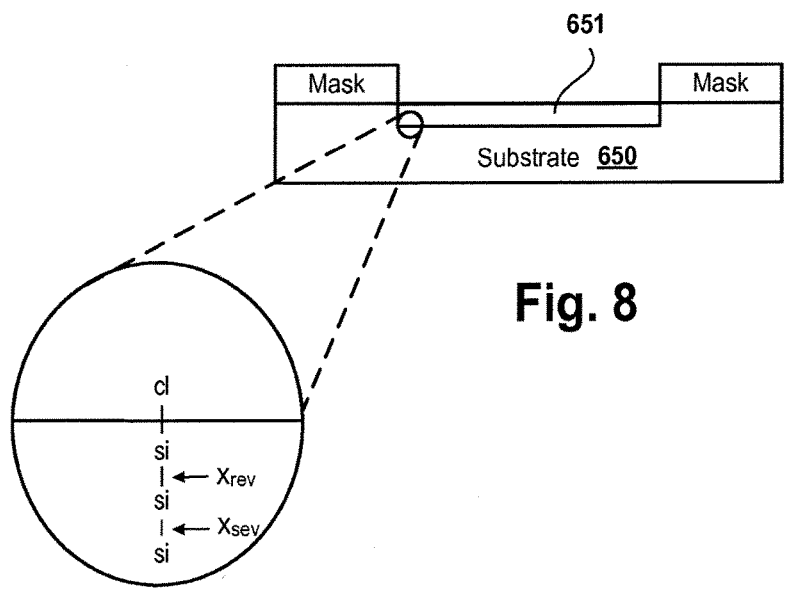
FIG. 8 is a diagram of an embodiment of a silicon substrate with a mask layer of silicon chloride or silicon bromide.

FIG. 8 is a diagram of an embodiment of the substrate 650 with a mask layer 651 of silicon chloride or silicon bromide. The substrate 650 with the mask layer 651 is an example of the workpiece 110 (FIGS. 1A thru 1C). Bonds are formed between silicon atoms in the substrate 650 and bonds are formed between silicon and chlorine or bromine in the mask layer 651. To etch the mask layer 651, a lower amount of energy, e.g., $x_i$ electron volts (eV), of ion energy is used than that used to etch the substrate 650, where $x_i$ is a real number greater than zero. For example, $x_s$ electron volts are used to etch the substrate 650 to break a bond between two silicon bonded to other silicon atoms and $x_r$ electron volts are used to break a bond between silicon and another silicon atom bonded to chlorine or bromine, where $x_r$ and $x_s$ are real numbers greater than zero. If $x_s > x_i > x_r$, the mask layer 651 can be selectively removed without affecting, e.g., removing, etc., the substrate 650. A precise control of energy of plasma allows the breakage of specific bonds, either within the substrate 650 or within the mask layer 651 that is being etched.

Figure 9:
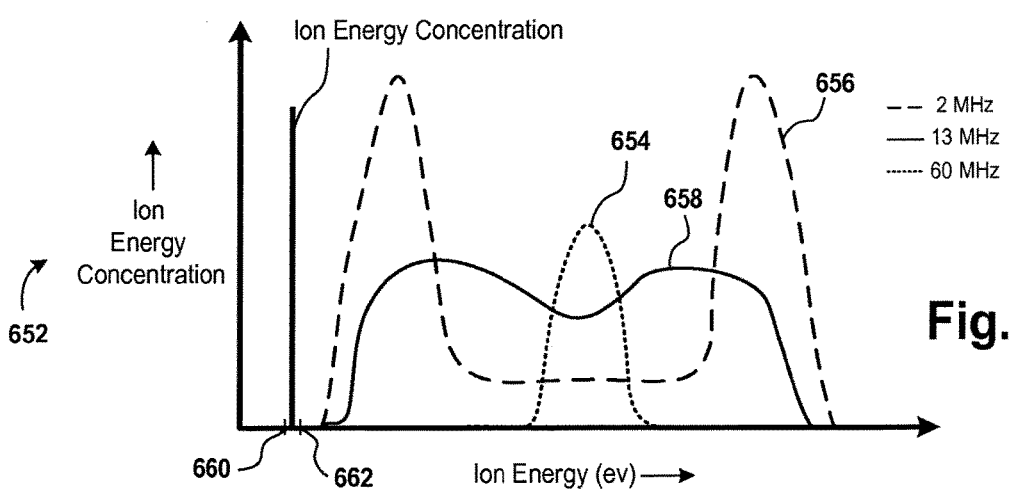
FIG. 9 is an embodiment of a graph that plots ion energy intensity versus ion energy.

FIG. 9 is an embodiment of a graph 652 that plots ion energy intensity versus ion energy. The ion energy intensity is plotted on a y-axis and the ion energy is plotted on an x-axis. The graph 652 plots the ion energy intensity and the ion energy for a 60 MHz RF generator in a dotted line 654, plots the ion energy intensity and the ion energy for a 2 MHz RF generator in a dashed line 656, and plots the ion energy intensity and the ion energy for a 13 MHz RF generator in a solid line 658.

As shown, a filtered nonsinusoidal RF signal is applied to the surface antenna 104 (FIGS. 1A thru 1C) or to the ESC 108 (FIGS. 1A thru 1C) to generate ion energy that is concentrated between a lower threshold 660, e.g., a lower value, etc., and an upper threshold 662, e.g., an upper value, etc., of ion energy. For example, a difference between the lower threshold 660 and the upper threshold 662 is less than or equal to 10 electron volts (eV) and greater than 0 eV. As another example, a difference between the lower threshold 660 and the upper threshold 662 is less than or equal to 5 electron volts (eV) and greater than 0 eV. As yet another example, a concentration of ion energy between the lower threshold 660 and the upper threshold 662 is achieved when a nonsinusoidal RF generator, e.g., the nonsinusoidal RF generator 120 (FIGS. 1A & 1C), the nonsinusoidal RF generator 214 (FIGS. 1A & 1C), etc., operates at a frequency of less than 13 MHz. As another example, a concentration of ion energy between the lower threshold 660 and the upper threshold 662 is achieved when a nonsinusoidal RF generator operates at a frequency less than 13.5 MHz. As yet another example, a concentration of ion energy between the lower threshold 660 and the upper threshold 662 is achieved when a nonsinusoidal RF generator, e.g., the nonsinusoidal RF generator 120 (FIGS. 1A & 1C), the nonsinusoidal RF generator 214 (FIGS. 1A & 1C), etc., operates at a frequency less than 16 MHz.

Figure 10A:
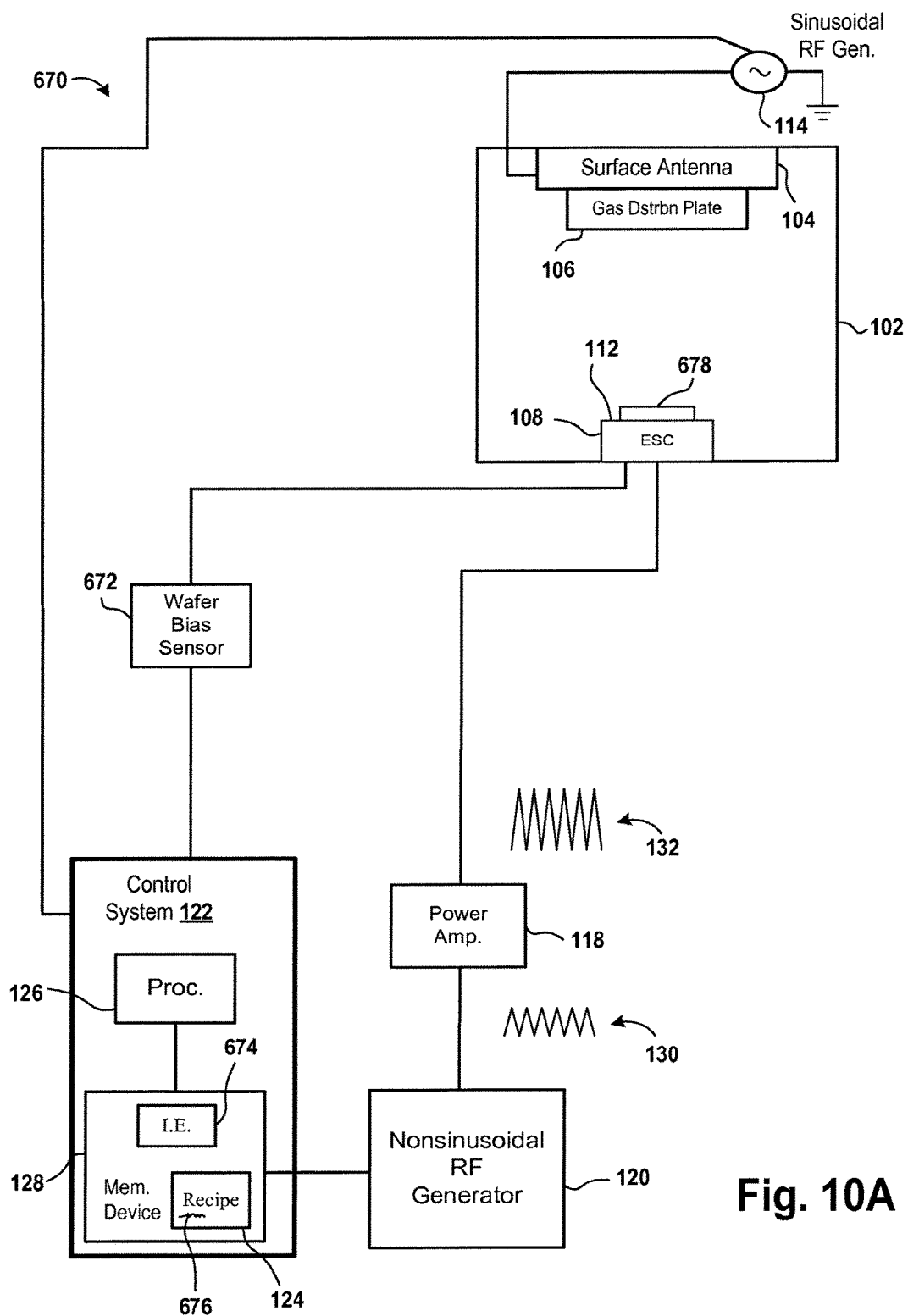
FIG. 10A is a block diagram of a calibration plasma system for determining a power profile to achieve ion energy when a filtered nonsinusoidal signal is applied to the ESC.

FIG. 10A is a block diagram of a calibration plasma system 670 for determining a power profile to achieve ion energy when the filtered nonsinusoidal signal 136 (FIG. 1A) is applied to the ESC 108. During calibration, the amplified nonsinusoidal signal 132 is generated in the same manner as that described above with reference to FIGS. 1A and is applied to the ESC 108. Moreover, during calibration, instead of the filtered nonsinusoidal RF signal 136, the amplified nonsinusoidal signal 132 is provided to the ESC 108 by the power amplifier 118 to generate plasma within the plasma chamber 102. Moreover, instead of the workpiece 110, a test workpiece 678 is used during calibration. The test workpiece 678 is similar to the workpiece 110 (FIG. 1A). For example, the test workpiece 678 has the same number and type of layers as that of the workpiece 110. To illustrate, when the workpiece 110 to be etched has a mask layer on top of a semiconductor substrate, the test workpiece 678 has a mask layer on top of a semiconductor substrate. To further illustrate, when the workpiece 110 to be etched lacks the mask layer and has a semiconductor layer, the test workpiece 678 lacks the mask layer and has a semiconductor layer. As another example, dimensions, e.g., diameter, thickness, etc., of the workpiece 110 are the same as that of the test workpiece 678.

When plasma is generated within the plasma chamber 102, a wafer bias sensor 672 that is coupled to the ESC 108 measures wafer bias at the ESC 108. An example of the wafer bias sensor 672 includes an in-situ direct current (DC) probe pick-up pin and related hardware that is used to measure wafer bias. As an example, the wafer bias sensor 672 measures wafer bias on the surface 112 of the ESC 108.

It should be noted that in some embodiments, a wafer bias is a direct current (DC) voltage that is created by plasma generated within the plasma chamber 102. In these embodiments, the wafer bias is present on a surface, e.g., the top surface 112, etc., of the ESC 108 and/or on a surface, e.g., an upper surface, of the work piece 110.

The processor 126 receives the wafer bias that is measured by the wafer bias sensor 672 and determines ion energy 674 from the wafer bias. For example, the processor 126 determines ion energy 674 as:

$$Ei = (-\tfrac{1}{2})Vdc + (\tfrac{1}{2})Vpeak \qquad (1)$$

where Ei is the ion energy 674, Vdc is the measured wafer bias potential at the ESC 108, and Vpeak is a zero-to-peak voltage at the ESC 108. In some embodiments, the zero-to-peak voltage Vpeak is measured by a voltage sensor (not shown), e.g., voltage probe, etc., that is coupled to the ESC 108. The ion energy 674 is stored in the memory device 128.

The recipe 124 includes a power profile 676, which is power of the amplified nonsinusoidal signal 132 that is generated by the power amplifier 118 as a function of time to achieve the ion energy 674. The recipe 124 further includes other parameters, e.g., pressure within the plasma chamber 102, temperature within the plasma chamber 102, gap between the surface antenna 104 and the ESC 108, a frequency of operation of the nonsinusoidal RF generator 120.

Plasma is formed in the plasma chamber 102 using the recipe 124. For example, plasma is formed within the plasma chamber 102 when an amount of pressure is maintained within the space of the plasma chamber 102, when an amount of temperature is maintained within the plasma chamber 102, when an amount of vertical gap between the surface antenna 104 and the ESC 108 is maintained within the plasma chamber, when the amplified nonsinusoidal signal 132 having the power profile 676 is generated, and when the nonsinusoidal RF generator 120 operates at a frequency of operation.

In some embodiments, the processor 126 controls a gas supply valve (not shown) that facilitates supply of a gas from a gas reservoir (not shown) to the gas inlets of the gas distribution plate 106. For example, the processor 126 controls a driver, e.g., a transistor, etc., that supplies a current to open or close the valve by an amount to control a supply of a gas, e.g., the process gas, etc., to the plasma chamber 102. The control of the supply also allows the processor 126 to control the pressure within the plasma chamber 102 in which the gas is supplied.

In various embodiments, the surface antenna 104 is located within an upper structure (not shown) that may be raised up or down using a motor-driven screw mechanism (not shown). The processor 126 may control the motor-driven screw mechanism via a driver, e.g., a transistor, etc., to move the upper structure up or down to change the gap between surface antenna 104 and the ESC 108 or between the surface antenna 104 and the gas distribution plate 106.

In several embodiments, a heater is included within the ESC 108 and the heater is controlled by the processor 126 via a driver, e.g., a transistor, etc., to change temperature within the plasma chamber 102.

In a number of embodiments, a heat transfer mechanism, e.g., a duct, etc., is provided within the plasma chamber 102 and a flow of a cooling liquid is controlled by the processor 126 via a valve and a driver, e.g., a transistor, etc., to change temperature within the plasma chamber 102.

In several embodiments, the processor 126 retrieves the power profile 676 from the memory device 128 and provides the power profile 676 to the nonsinusoidal RF generator 120 and to the power amplifier 118. Upon receiving the power profile 676, the nonsinusoidal RF generator 120 generates the nonsinusoidal RF signal 130. Moreover, upon receiving the power profile 676 and the nonsinusoidal RF signal 130, the power amplifier 118 generates the amplified nonsinusoidal RF signal 132 having the power profile 676.

In a number of embodiments, the nonsinusoidal RF generator 120 receives a frequency of operation of the nonsinusoidal RF signal 130 from the processor 126 and generates the nonsinusoidal RF signal 130 having the frequency.

The processor 126 associates, e.g., forms a link between, etc., the power profile 676 and the ion energy 674.

Figure 10B:
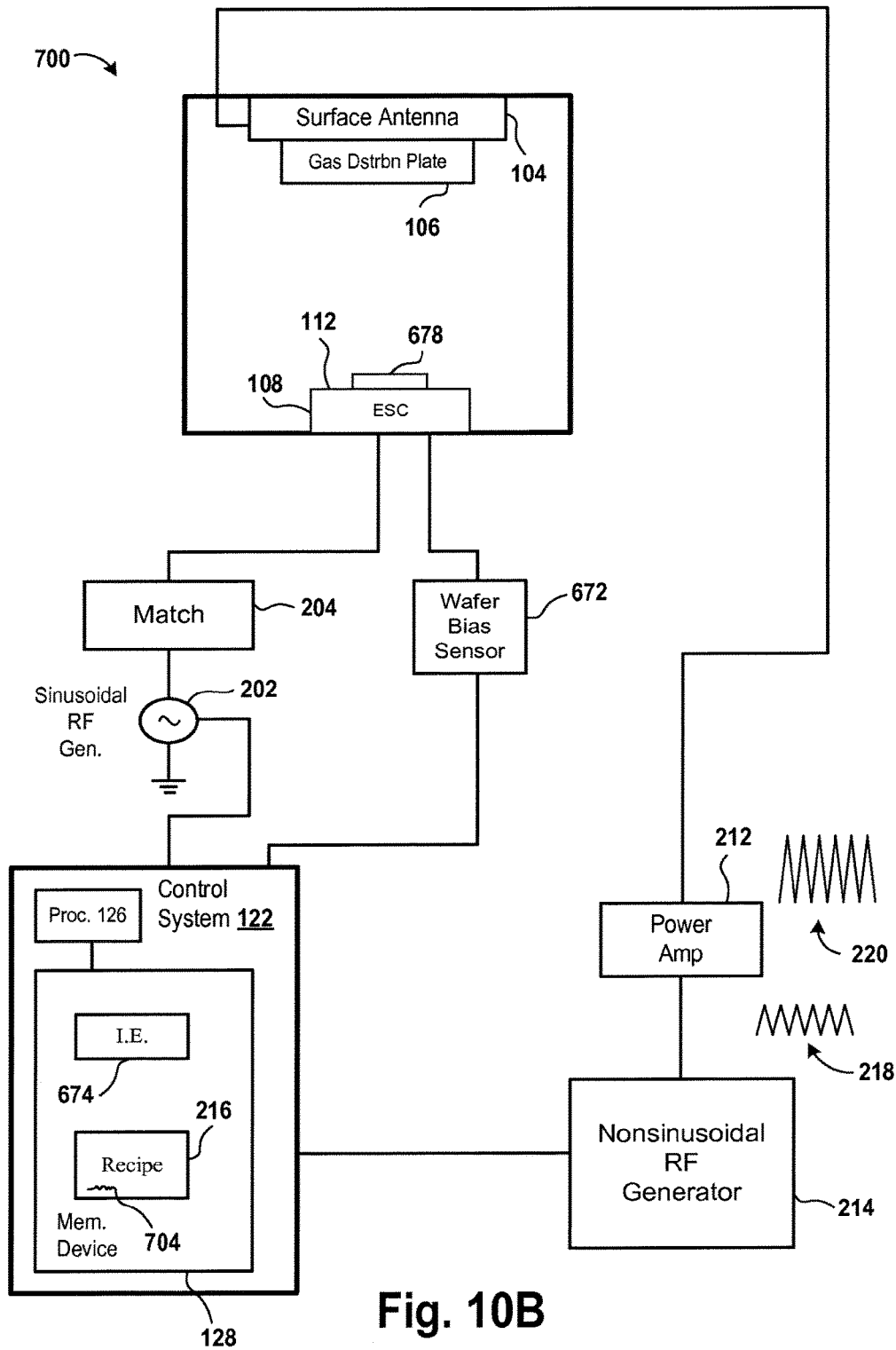
FIG. 10B is a block diagram of a calibration plasma system for determining a power profile to achieve ion energy when a filtered nonsinusoidal signal is applied to the surface antenna.

FIG. 10B is a block diagram of a calibration plasma system 700 for determining a power profile to achieve ion energy when the filtered nonsinusoidal signal 224 (FIG. 1B) is applied to the surface antenna 104. During calibration, the amplified nonsinusoidal RF signal 220 is generated in the same manner as that described above with reference to FIG. 1B and is applied to the surface antenna 104. Moreover, during calibration, instead of the filtered nonsinusoidal RF signal 224, the amplified nonsinusoidal RF signal 220 is provided to the surface antenna 104 by the power amplifier 118 to generate plasma within the plasma chamber 102. Moreover, instead of the workpiece 110, the test workpiece 678 is used during calibration.

When plasma is generated within the plasma chamber 102, the wafer bias sensor 672 measures wafer bias at the ESC 108. The processor 126 receives the wafer bias that is measured by the wafer bias sensor 672 and determines the ion energy 674 from the wafer bias in the same manner as that described above with reference to FIG. 10A.

The recipe 216 includes a power profile 704, which is power of the amplified nonsinusoidal RF signal 220 that is generated by the power amplifier 212 as a function of time to achieve the ion energy 674. The recipe 216 further includes other parameters, e.g., pressure within the plasma chamber 102, temperature within the plasma chamber 102, gap between the surface antenna 104 and the ESC 108, a frequency of operation of the nonsinusoidal RF generator 214.

Plasma is formed in the plasma chamber 102 using the recipe 216. For example, plasma is formed within the plasma chamber 102 when an amount of pressure is maintained within the space of the plasma chamber 102, when an amount of temperature is maintained within the plasma chamber 102, when an amount of vertical gap between the surface antenna 104 and the ESC 108 is maintained within the plasma chamber, when the amplified nonsinusoidal RF signal 220 having the power profile 704 is generated, and when the nonsinusoidal RF generator 214 operates at a frequency of operation.

In several embodiments, the processor 126 retrieves the power profile 704 from the memory device 128 and provides the power profile 704 to the nonsinusoidal RF generator 214 and to the power amplifier 212. Upon receiving the power profile 704, the nonsinusoidal RF generator 214 generates the nonsinusoidal RF signal 218. Moreover, upon receiving the power profile 704 and the nonsinusoidal RF signal 218, the power amplifier 212 generates the amplified nonsinusoidal RF signal 220 having the power profile 704.

In a number of embodiments, the nonsinusoidal RF generator 214 receives a frequency of operation of the nonsinusoidal RF signal 218 from the processor 126 and generates the nonsinusoidal RF signal 218 having the frequency.

The processor 126 associates, e.g., forms a link between, etc., the power profile 704 and the ion energy 674.

Figure 10C:
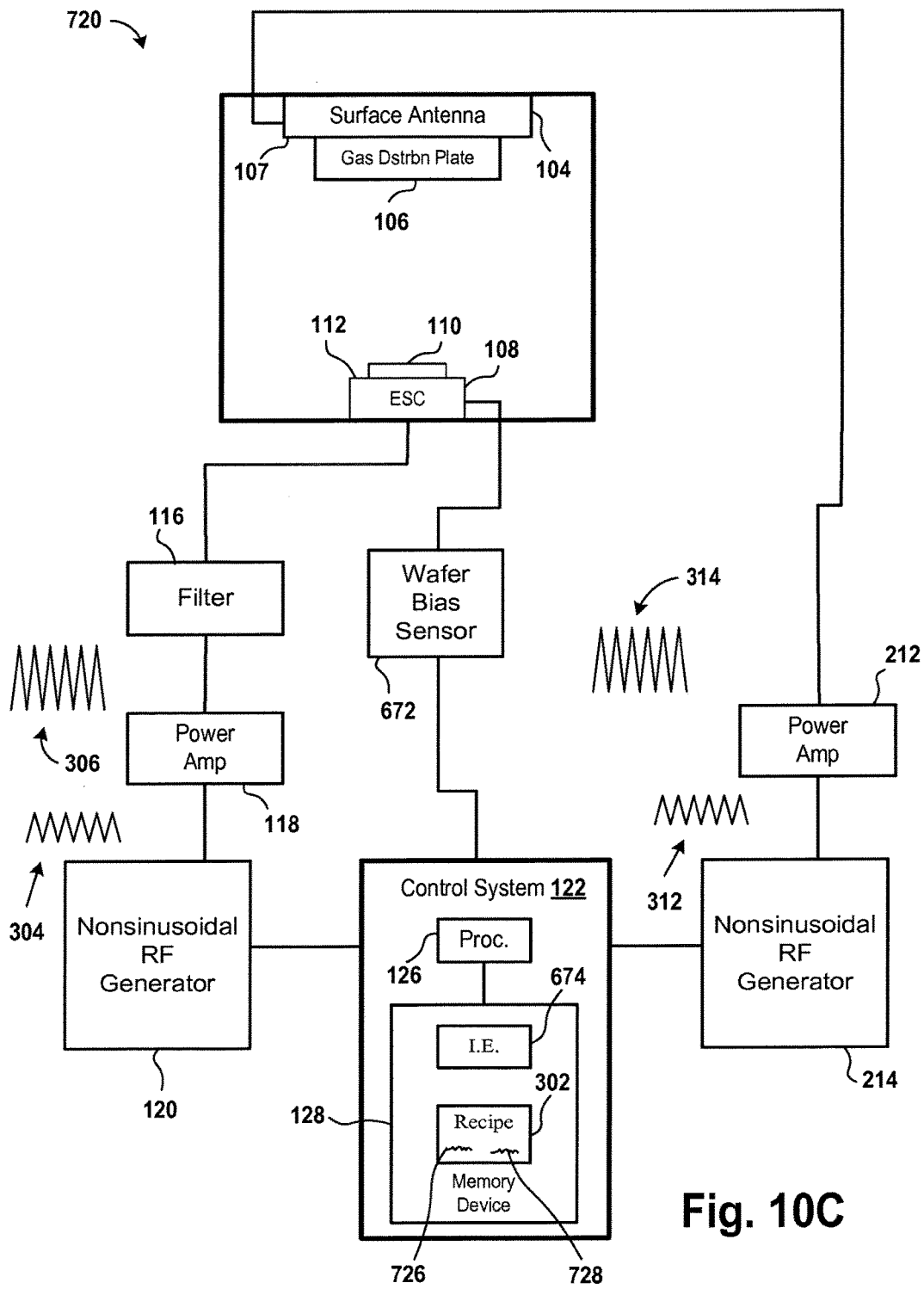
FIG. 10C is a block diagram of a calibration plasma system for determining a power profile to achieve ion energy when a filtered nonsinusoidal signal is applied to the ESC and a filtered nonsinusoidal signal is applied to the surface antenna.

FIG. 10C is a block diagram of a calibration plasma system 720 for determining a power profile to achieve ion energy when the filtered nonsinusoidal signal 310 (FIG. 1C) is applied to the ESC 108 and when the filtered nonsinusoidal signal 318 (FIG. 1C) is applied to the surface antenna 104. During calibration, the amplified nonsinusoidal signal 306 is generated in the same manner as that described above with reference to FIGS. 1C and is applied to the ESC 108 and the amplified nonsinusoidal signal 314 is generated in the same manner as that described above with reference to FIGS. 1C and is applied to the surface antenna 104. Moreover, during calibration, instead of the filtered nonsinusoidal RF signal 310, the amplified nonsinusoidal signal 306 is provided to the ESC 108 by the power amplifier 118 and instead of the filtered nonsinusoidal RF signal 318, the amplified nonsinusoidal signal 314 is provided to the surface antenna 104 by the power amplifier 212 to generate plasma within the plasma chamber 102. Moreover, instead of the workpiece 110, the test workpiece 678 is used during calibration.

When plasma is generated within the plasma chamber 102, the wafer bias sensor 672 measures wafer bias at the ESC 108. The processor 126 receives the wafer bias that is measured by the wafer bias sensor 672 and determines the ion energy 674 from the wafer bias in the same manner as that described above with reference to FIG. 10A.

The recipe 302 includes a power profile 726, which is power of the amplified nonsinusoidal signal 306 that is generated by the power amplifier 118 as a function of time to achieve the ion energy 674 at the ESC 108. The recipe 302 also includes a power profile 728, which is power of the amplified nonsinusoidal signal 314 that is generated by the power amplifier 212 as a function of time to achieve the ion energy 674 at the ESC 108. The recipe 302 further includes other parameters, e.g., pressure within the plasma chamber 102, temperature within the plasma chamber 102, gap between the surface antenna 104 and the ESC 108, a frequency of operation of the nonsinusoidal RF generator 120, and a frequency of operation of the nonsinusoidal RF generator 214.

Plasma is formed in the plasma chamber 102 using the recipe 302. For example, plasma is formed within the plasma chamber 102 when an amount of pressure is maintained within the space of the plasma chamber 102, when an amount of temperature is maintained within the plasma chamber 102, when an amount of vertical gap between the surface antenna 104 and the ESC 108 is maintained within the plasma chamber, when the amplified nonsinusoidal signal 306 having the power profile 726 is generated, when the nonsinusoidal RF generator 120 operates at a frequency of operation, when the amplified nonsinusoidal signal 314 having the power profile 728 is generated, when the nonsinusoidal RF generator 214 operates at a frequency of operation.

The processor 126 retrieves the power profile 726 from the memory device 128 and provides the power profile 726 to the nonsinusoidal RF generator 120 and to the power amplifier 118. Upon receiving the power profile 726, the nonsinusoidal RF generator 120 generates the nonsinusoidal RF signal 304. Moreover, upon receiving the power profile 726 and the nonsinusoidal RF signal 304, the power amplifier 118 generates the amplified nonsinusoidal RF signal 306 having the power profile 726.

The processor 126 retrieves the power profile 728 from the memory device 128 and provides the power profile 728 to the nonsinusoidal RF generator 214 and to the power amplifier 212. Upon receiving the power profile 728, the nonsinusoidal RF generator 214 generates the nonsinusoidal RF signal 314. Moreover, upon receiving the power profile 728 and the nonsinusoidal RF signal 314, the power amplifier 212 generates the amplified nonsinusoidal RF signal 314 having the power profile 728.

The nonsinusoidal RF generator 120 receives a frequency of operation of the nonsinusoidal RF signal 304 from the processor 126 and generates the nonsinusoidal RF signal 304 having the frequency. Similarly, the nonsinusoidal RF generator 214 receives a frequency of operation of the nonsinusoidal RF signal 312 from the processor 126 and generates the nonsinusoidal RF signal 312 having the frequency.

The processor 126 associates, e.g., forms a link between, etc., the power profile 726 and the ion energy 674. Moreover, the processor 126 associates, e.g., forms a link between, etc., the power profile 728 and the ion energy 674.

FIG. 11 is a diagram of embodiment of a database that includes recipes A and B. The recipe A is an example of the recipe 124 (FIG. 1A), the recipe 216 (FIG. 1B), or the recipe 302 (FIG. 1C). Moreover, the recipe B is another example of the recipe 124 (FIG. 1A), the recipe 216 (FIG. 1B), or the recipe 302 (FIG. 1C).

The recipe A indicates that a pressure a1 Torr be maintained within the plasma chamber 102 (FIGS. 1A thru 1C, FIGS. 10A thru 10C), that a temperature b1 degrees Fahrenheit be maintained within the plasma chamber 102, and that a frequency of operation of d1 of a nonsinusoidal RF generator, e.g., the nonsinusoidal RF generator 120 (FIG. 1A, FIG. 10A), the nonsinusoidal RF generator 214 (FIG. 1B, FIG. 10B), etc., be maintained. Moreover, the recipe A includes that a gap between the surface antenna 104 and the ESC 108 of e1 nanometers (nm) be maintained, and that a power profile of an amplified nonsinusoidal signal, e.g., the amplified nonsinusoidal signal 132 (FIG. 1A), or the amplified nonsinusoidal RF signal 220 (FIG. 1B), etc., having power amplitudes f1, g1, h1, and i1 at different times of a clock cycle be maintained.

In various embodiments, a power profile includes any number of power amplitudes to be maintained during a clock cycle. Moreover, in some embodiments in which two nonsinusoidal RF generators are used simultaneously, e.g., the use of the nonsinusoidal RF generators 120 and 214 in the plasma system 300 (FIG. 1C), etc., instead of one frequency of operation, the recipe A includes two frequencies of operation, one for the nonsinusoidal RF generator 120 and another for the nonsinusoidal RF generator 214. Also, in these embodiments, instead of one set of the power profiles f1, g1, h1, and i1, the recipe A includes two sets of power profiles, one that includes power amplitudes of the amplified nonsinusoidal signal 306 and another that includes power profiles of the amplified nonsinusoidal signal 314.

The recipe B indicates that a pressure a2 Torr be maintained within the plasma chamber 102 (FIGS. 1A thru 1C, FIGS. 10A thru 10C), that a temperature b2 degrees Fahrenheit be maintained within the plasma chamber 102, and that a frequency of operation of d2 of a nonsinusoidal RF generator, e.g., the nonsinusoidal RF generator 120 (FIG. 1A, FIG. 10A), the nonsinusoidal RF generator 214 (FIG. 1B, FIG. 10B), etc., be maintained. Moreover, the recipe B indicates that a gap between the surface antenna 104 and the ESC 108 of e2 nm be maintained, and that a power profile of an amplified nonsinusoidal signal, e.g., the amplified nonsinusoidal signal 132 (FIG. 1A), the amplified nonsinusoidal RF signal 220 (FIG. 1B), etc., having power amplitudes f2, g2, h2, and i2 at different times of a clock cycle be maintained.

In various embodiments, a power profile includes any number of power amplitudes to be maintained during a clock cycle. Moreover, in some embodiments in which two nonsinusoidal RF generators are used simultaneously, e.g., the use of the nonsinusoidal RF generators 120 and 214 in the plasma system 300 (FIG. 1C), etc., instead of one frequency of operation, the recipe B includes two frequencies of operation, one for the nonsinusoidal RF generator 120 and another for the nonsinusoidal RF generator 214. Also, in these embodiments, instead of one set of the power profiles f2, g2, h2, and i2, the recipe B includes two sets of power profiles, one that includes power amplitudes of the amplified sinusoidal signal 306 and another that includes power profiles of the amplified sinusoidal signal 314.

In various embodiments, at least one but not all values of the recipes A and B are same. For example, the value a1 is equal to a2, the value b1 is equal to b2, the value c1 is equal to c2, the value d1 is equal to d2, the value e1 is equal to e2, the value f1 is equal to f2, the value g1 is equal to g2, the value h1 is equal to h2, and the value i1 is not equal to i2. As another example, the value a1 is not equal to a2, the value b1 is equal to b2, the value c1 is equal to c2, the value d1 is equal to d2, the value e1 is equal to e2, the value f1 is equal to f2, the value g1 is equal to g2, the value h1 is equal to h2, and the value i1 is equal to i2.

It is further noted that although the above-described operations are described with reference to an inductively coupled plasma (ICP) chamber, e.g., an inductively coupled plasma chamber, etc., in some embodiments, the above-described operations apply to other types of plasma chambers, e.g., a capacitively coupled plasma (CCP) chamber, a plasma chamber including a transformer coupled plasma (TCP) reactor, a conductor tool, a dielectric tool, a plasma chamber including an electron cyclotron resonance (ECR) reactor, etc.

It is also noted that although the operations above are described as being performed by the processor 126 (FIGS. 1A thru 1C, FIGS. 10A thru 10C), in some embodiments, the operations may be performed by one or more processors of the control system 122 or by multiple processors of multiple control systems.

It is also noted that although the above-described embodiments are described using an ESC, another type of chuck, e.g., a magnetic chuck, etc., may be used.

Embodiments described herein may be practiced with various computer system configurations including hand-held hardware units, microprocessor systems, microprocessor-based or programmable consumer electronics, minicomputers, mainframe computers and the like. The embodiments may also be practiced in distributed computing environments where tasks are performed by remote processing hardware units that are linked through a network.

With the above embodiments in mind, it should be understood that the embodiments may employ various computer-implemented operations involving data stored in computer systems. These operations are those requiring physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although the method operations above were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method comprising:
   generating a sinusoidal radio frequency (RF) signal for providing to an upper electrode of a plasma chamber;
   generating a nonsinusoidal RF signal;
   amplifying the nonsinusoidal RF signal to generate an amplified nonsinusoidal RF signal;
   filtering the amplified nonsinusoidal RF signal to generate a filtered nonsinusoidal RF signal having a first series of pulses and a second series of pulses, wherein the second series of pulses has a different amplification level than an amplification level of the first series of pulses; and
   providing the filtered nonsinusoidal RF signal to a lower electrode of the plasma chamber.

2. The method of claim 1, wherein said generating the nonsinusoidal RF signal comprises:
   generating a second sinusoidal RF signal;
   filtering the second sinusoidal RF signal to output the nonsinusoidal RF signal.

3. The method of claim 1, wherein amplifying the nonsinusoidal RF signal comprises increasing a magnitude of the nonsinusoidal RF signal.

4. The method of claim 1, wherein the second series of pulses is consecutive to the first series of pulses, wherein the filtered nonsinusoidal RF signal has a third series of pulses and a fourth series of pulses, wherein the third series of pulses is another occurrence of the first series of pulses and the fourth series of pulses is another occurrence of the second series of pulses, wherein the third series of pulses is consecutive to the second series of pulses, and the fourth series of pulses is consecutive to the third series of pulses.

5. The method of claim 1, wherein providing the filtered nonsinusoidal RF signal to the lower electrode is performed to adjust ion energy within the plasma chamber to be between a lower threshold and an upper threshold, wherein the upper threshold is greater than the lower threshold.

6. The method of claim 1, wherein the upper electrode is a surface inductor or a capacitive plate, and the lower electrode is an electrostatic chuck.

7. The method of claim 1, wherein the amplification level of the second series of pulses is lower than the amplification level of the first series of pulses, wherein the amplification level of the first series of pulses is a peak-to-peak magnitude of the first series of pulses, wherein the amplification level of the second series of pulses is a peak-to-peak magnitude of the second series of pulses.

8. A method comprising:
   generating a sinusoidal radio frequency (RF) signal for providing to a lower electrode of a plasma chamber;
   generating a nonsinusoidal RF signal;
   amplifying the nonsinusoidal RF signal to generate an amplified nonsinusoidal RF signal;
   filtering the amplified nonsinusoidal RF signal to generate a filtered nonsinusoidal RF signal having a first series of pulses and a second series of pulses, wherein the second series of pulses has a different amplification level than an amplification level of the first series of pulses; and
   providing the filtered nonsinusoidal RF signal to an upper electrode of the plasma chamber.

9. The method of claim 8, wherein said generating the nonsinusoidal RF signal comprises:
   generating a second sinusoidal RF signal;
   filtering the second sinusoidal RF signal to output the nonsinusoidal RF signal.

10. The method of claim 8, wherein amplifying the nonsinusoidal RF signal comprises increasing a magnitude of the nonsinusoidal RF signal.

11. The method of claim 8, wherein the second series of pulses is consecutive to the first series of pulses, wherein the filtered nonsinusoidal RF signal has a third series of pulses and a fourth series of pulses, wherein the third series of pulses is another occurrence of the first series of pulses and the fourth series of pulses is another occurrence of the second series of pulses, wherein the third series of pulses is consecutive to the second series of pulses, and the fourth series of pulses is consecutive to the third series of pulses.

12. The method of claim 8, wherein providing the filtered nonsinusoidal RF signal to the upper electrode is performed to adjust ion energy within the plasma chamber to be between a lower threshold and an upper threshold, wherein the upper threshold is greater than the lower threshold.

13. The method of claim 8, wherein the upper electrode is a surface inductor or a capacitive plate, and the lower electrode is an electrostatic chuck.

14. The method of claim 8, wherein the amplification level of the second series of pulses is lower than the amplification level of the first series of pulses, wherein the amplification level of the first series of pulses is a peak-topeak magnitude of the first series of pulses, wherein the amplification level of the second series of pulses is a peak-to-peak magnitude of the second series of pulses.

15. A method comprising:
generating a first nonsinusoidal RF signal;
amplifying the first nonsinusoidal RF signal to generate a first amplified nonsinusoidal RF signal;
filtering the first amplified nonsinusoidal RF signal to generate a first filtered nonsinusoidal RF signal having a first series of pulses and a second series of pulses, wherein the second series of pulses has a different amplification level than an amplification level of the first series of pulses;
providing the first filtered nonsinusoidal RF signal to a lower electrode of the plasma chamber;
generating a second nonsinusoidal RF signal;
amplifying the second nonsinusoidal RF signal to generate a second amplified nonsinusoidal RF signal;
filtering the second amplified nonsinusoidal RF signal to generate a second filtered nonsinusoidal RF signal having a third series of pulses and a fourth series of pulses, wherein the fourth series of pulses has a different amplification level than an amplification level of the third series of pulses; and
providing the second filtered nonsinusoidal RF signal to an upper electrode of the plasma chamber.

16. The method of claim 15,
wherein said generating the first nonsinusoidal RF signal comprises:
generating a first sinusoidal RF signal;
filtering the first sinusoidal RF signal to output the first nonsinusoidal RF signal, and
wherein said generating the second nonsinusoidal RF signal comprises:
generating a second sinusoidal RF signal;
filtering the second sinusoidal RF signal to output the second nonsinusoidal RF signal.

17. The method of claim 15, wherein amplifying the first nonsinusoidal RF signal comprises increasing a magnitude of the first nonsinusoidal RF signal, and amplifying the second nonsinusoidal RF signal comprises increasing a magnitude of the second nonsinusoidal RF signal.

18. The method of claim 15,
wherein the second series of pulses is consecutive to the first series of pulses, wherein the first filtered nonsinusoidal RF signal has a fifth series of pulses and a sixth series of pulses, wherein the fifth series of pulses is another occurrence of the first series of pulses and the sixth series of pulses is another occurrence of the second series of pulses, wherein the fifth series of pulses is consecutive to the second series of pulses, and the sixth series of pulses is consecutive to the fifth series of pulses, wherein the fourth series of pulses is consecutive to the third series of pulses, wherein the second filtered nonsinusoidal RF signal has a seventh series of pulses and an eighth series of pulses, wherein the seventh series of pulses is another occurrence of the third series of pulses and the eighth series of pulses is another occurrence of the fourth series of pulses, wherein the seventh series of pulses is consecutive to the fourth series of pulses, and the eighth series of pulses is consecutive to the seventh series of pulses.

19. The method of claim 15, wherein providing the first filtered nonsinusoidal RF signal to the lower electrode and providing the second filtered nonsinusoidal RF signal to the upper electrode are performed to adjust ion energy within the plasma chamber to be between a lower threshold and an upper threshold, wherein the upper threshold is greater than the lower threshold.

20. The method of claim 15, wherein the upper electrode is a surface inductor or a capacitive plate, and the lower electrode is an electrostatic chuck.

21. The method of claim 15,
wherein the amplification level of the second series of pulses is lower than the amplification level of the first series of pulses, wherein the amplification level of the first series of pulses is a peak-to-peak magnitude of the first series of pulses, wherein the amplification level of the second series of pulses is a peak-to-peak magnitude of the second series of pulses, wherein the amplification level of the fourth series of pulses is lower than the amplification level of the third series of pulses, wherein the amplification level of the third series of pulses is a peak-to-peak magnitude of the third series of pulses, wherein the amplification level of the fourth series of pulses is a peak-to-peak magnitude of the fourth series of pulses.

* * * * *